United States Patent
Nakamura et al.

(10) Patent No.: US 9,023,585 B2
(45) Date of Patent: May 5, 2015

(54) RESIST COMPOSITION AND METHOD OF FORMING RESIST PATTERN

(71) Applicant: Tokyo Ohka Kogyo Co., Ltd., Kawasaki-shi (JP)

(72) Inventors: Tsuyoshi Nakamura, Kawasaki (JP); Jiro Yokoya, Kawasaki (JP); Hideto Nito, Kawasaki (JP); Hiroaki Shimizu, Kawasaki (JP)

(73) Assignee: Tokyo Ohka Kogyo Co., Ltd, Kawasaki-shi (JP)

(*) Notice: Subject to any disclaimer, the term of this patent is extended or adjusted under 35 U.S.C. 154(b) by 0 days.

(21) Appl. No.: 13/922,758

(22) Filed: Jun. 20, 2013

(65) Prior Publication Data

US 2013/0344436 A1    Dec. 26, 2013

(30) Foreign Application Priority Data

Jun. 21, 2012 (JP) ................. 2012-139756

(51) Int. Cl.
  *G03F 7/004* (2006.01)
  *G03F 7/039* (2006.01)
  *G03F 7/20* (2006.01)
  *G03F 7/30* (2006.01)
  *G03F 7/38* (2006.01)

(52) U.S. Cl.
  CPC ............ *G03F 7/004* (2013.01); *Y10S 430/12* (2013.01); *Y10S 430/121* (2013.01)

(58) Field of Classification Search
  None
  See application file for complete search history.

(56) References Cited

U.S. PATENT DOCUMENTS

| 2004/0110085 A1 | 6/2004 | Iwai et al. |
| 2011/0091812 A1 | 4/2011 | Hatakeyama et al. |
| 2013/0177854 A1* | 7/2013 | Utsumi et al. ............. 430/285.1 |

FOREIGN PATENT DOCUMENTS

| JP | A-2003-241385 | 8/2003 |
| JP | A-2007-279493 | 10/2007 |
| JP | A-2009-025723 | 2/2009 |
| JP | A-2011-102974 | 5/2011 |

* cited by examiner

*Primary Examiner* — Sin J. Lee
(74) *Attorney, Agent, or Firm* — Knobbe Martens Olson & Bear, LLP

(57) ABSTRACT

A resist composition which generates a base upon exposure and exhibits increased solubility in an alkali developing solution under the action of acid, and the resist composition including: a base component (A) that exhibits increased solubility in an alkali developing solution under the action of acid; an acidic compound component (G1) including a nitrogen-containing cation having a pKa value of 7 or less and a counteranion; and a buffer component (K) including a nitrogen-containing cation and a counteranion being a conjugate base for the acid having a pKa value of 0 to 5.

15 Claims, 1 Drawing Sheet

RESIST COMPOSITION AND METHOD OF FORMING RESIST PATTERN

TECHNICAL FIELD

The present invention relates to a resist composition and a method of forming a resist pattern.

Priority is claimed on Japanese Patent Application No. 2012-139756, filed Jun. 21, 2012, the content of which is incorporated herein by reference.

BACKGROUND ART

In lithography techniques, for example, a resist film containing a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use an exposure light source having a shorter wavelength (higher energy) than these excimer lasers, such as extreme ultraviolet radiation (EUV), electron beam (EB), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is conventionally used, which includes a base component that exhibits increased solubility in an alkali developing solution under the action of acid, and an acid generator component that generates acid upon exposure (for example, Patent Document 1).

In addition, a solvent developing process in which a developing solution containing an organic solvent (organic developing solution) is used instead of an alkali developing solution for a chemically amplified composition including similar components to those of the above chemically amplified composition is also known (for example, Patent Document 2).

In the case where the solvent developing process is employed, when the polarity of a base resin is increased, the solubility in the organic developing solution decreases relatively. As a result, the unexposed portions of the resist film are dissolved in the organic developing solution and removed, whereas the exposed portions remain as a pattern, resulting in the formation of a negative-type resist pattern. This type of solvent developing process that results in the formation of a negative-type resist pattern is also referred to as a negative tone development process.

DOCUMENTS OF RELATED ART

Patent Documents

[Patent Document 1] Japanese Unexamined Patent Application, First Publication No. 2003-241385

[Patent Document 2] Japanese Unexamined Patent Application, First Publication No. 2009-025723

SUMMARY OF THE INVENTION

In the formation of the aforementioned extremely small pattern, a method of forming a resist pattern (negative pattern) in which regions where the optical strength becomes weak (regions where irradiation by exposure is not satisfactorily reached) are selectively dissolved and removed is useful. However, negative-tone developing process is inferior to a positive-tone developing process using an alkali developing solution in combination with a chemically amplified resist composition in terms of environment, apparatus and cost. Therefore, a novel method of forming a resist pattern, the method being capable of forming a negative pattern which exhibits excellent lithography properties is required.

Further, resist compositions are required to improve not only lithography properties but also post exposure stability of the latent image formed by the pattern-wise exposure of the resist layer. Specifically, the resist compositions are demanded which are capable of obtaining excellent lithography properties or the like, even when patterns are formed using a resist film past for a certain period after forming the resist composition, similarly when patterns are formed using a resist film immediately after forming the resist film.

The present invention takes the above circumstances into consideration, with an object of providing a resist composition that exhibits excellent post exposure stability of the latent image formed by the pattern-wise exposure of the resist layer, and a method of forming a resist pattern using the resist composition.

For solving the above-mentioned problems, the present invention employs the following aspects.

Specifically, the present invention is a resist composition which generates a base upon exposure and exhibits increased solubility in an alkali developing solution under the action of acid, and the resist composition including: a base component (A) that exhibits increased solubility in an alkali developing solution under the action of acid; an acidic compound component (G1) containing a nitrogen-containing cation having a pKa value of 7 or less and a counteranion; and a buffer component (K) containing a nitrogen-containing cation and a counteranion being a conjugate base for the acid having a pKa value of 0 to 5.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atoms.

The term "structural unit" refers to a monomer unit that contributes to the formation of a polymeric compound (namely, a resin, polymer or copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

In the following description, an acrylate ester in which the hydrogen atom bonded to the carbon atom on the α-position is substituted with a substituent may also be termed an "α-substituted acrylate ester". Further, the generic term "(α-substituted) acrylate ester" may be used to describe either or both of the acrylate ester and the α-substituted acrylate ester.

A "structural unit derived from hydroxystyrene or a hydroxystyrene derivative" refers to a structural unit that is formed by the cleavage of the ethylenic double bond of hydroxystyrene or a hydroxystyrene derivative.

The expression "hydroxystyrene derivative" is a generic term that includes compounds in which the hydrogen atom on the α-position of hydroxystyrene has been substituted with a substituent such as an alkyl group or a halogenated alkyl group, and derivatives thereof. Examples of the derivatives thereof include a hydroxystyrene in which the hydrogen atom on the α-position thereof may be substituted with a substituent and in which the hydrogen atom of the hydroxyl group has been substituted with an organic group, and a hydroxystyrene in which the hydrogen atom on the α-position thereof may be substituted with a substituent and in which a substituent other than a hydroxyl group is bonded to the benzene ring thereof. Unless specified otherwise, "the α-position" ("carbon atom on the α-position") refers to the carbon atom to which the benzene group is bonded.

Examples of the substituent which may substitute the hydrogen atom on the α-position of the hydroxystyrene include the same as those described above for the substituent on the α-position in the α-substituted acrylate ester.

A "structural unit derived from a vinylbenzoic acid or a vinylbenzoic acid derivative" refers to a structural unit that is configured by the cleavage of the ethylenic double bond of a vinylbenzoic acid or a vinylbenzoic acid derivative.

The expression "vinylbenzoic acid derivative" is a generic term that includes compounds in which the hydrogen atom on the α-position of vinylbenzoic acid has been substituted with a substituent such as an alkyl group or a halogenated alkyl group, and derivatives thereof. Examples of the derivatives thereof include a vinylbenzoic acid in which the hydrogen atom on the α-position thereof may be substituted with a substituent and in which the hydrogen atom of the carboxy group has been substituted with an organic group, and a vinylbenzoic acid in which the hydrogen atom on the α-position thereof may be substituted with a substituent and in which a substituent other than a hydroxyl group and a carboxy group is bonded to the benzene ring thereof. Unless specified otherwise, "the α-position" ("carbon atom on the α-position") refers to the carbon atom to which the benzene group is bonded.

The term "styrene" includes a styrene and styrenes in which the hydrogen atom at the α-position has been substituted with a substituent such as an alkyl group or a halogenated alkyl group.

A "structural unit derived from a styrene" or "structural unit derived from a styrene derivative" refers to a structural unit that is configured by the cleavage of the ethylenic double bond of a styrene or a styrene derivative.

The alkyl group as the substituent on the α-position is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group of 1 to 5 carbon atoms as the substituent on the α-position include groups in which part or all of the hydrogen atoms of the aforementioned "alkyl group of 1 to 5 carbon atoms as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group of 1 to 5 carbon atoms as the substituent on the α-position include groups in which part or all of the hydrogen atoms of the aforementioned "alkyl group of 1 to 5 carbon atoms as the substituent on the α-position" are substituted with a hydroxy group. The number of hydroxy groups within the hydroxyalkyl group is preferably 1 to 5, and most preferably 1.

The term "exposure" is used as a general concept that includes irradiation with any form of radiation.

According to the present invention, there is provided a resist composition that exhibits excellent post exposure stability of the latent image formed by the pattern-wise exposure of the resist layer, and a method of forming a resist pattern using the resist composition.

MODE FOR CARRYING OUT THE INVENTION

<<Resist Composition>>

Figure 1A:
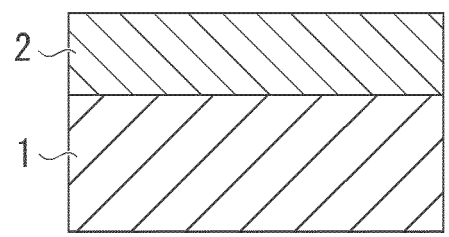
FIG. 1A to FIG. 1D are schematic diagrams showing an example of one embodiment of the method of forming a resist pattern according to the present invention.

The resist composition of the present invention is which generates a base upon exposure and exhibits increased solubility in an alkali developing solution under the action of acid, and includes: a base component (A) (hereafter, referred to as "component (A)") that exhibits increased solubility in an alkali developing solution under the action of acid; an acidic compound component (G1) containing a nitrogen-containing cation having a pKa value of 7 or less and a counteranion; and a buffer component (K) containing a nitrogen-containing cation and a counteranion being a conjugate base for the acid having a pKa value of 0 to 5.

The resist composition of the present invention has a capability of generating a base that generates a base upon exposure. The component (A) may generate a base upon exposure or an additive component blended aside from the component (A) may generate a base upon exposure.

Specifically, (1) the resist composition of the present invention may include a base generator component (C) (hereafter, referred to as "component (C)") that generates a base upon exposure;

(2) in the resist composition of the present invention, the component (A) may generate a base upon exposure; and (3) in the resist composition of the present invention, the component (A) generates a base upon exposure, and the resist composition of the present invention may further include the component (C).

That is, in the case of (2) or (3), the component (A) indicates a "base component that generates a base upon exposure and exhibits a changed solubility in a developing solution under the action of acid". When the component (A) is the base component that generates a base upon exposure and exhibits a changed solubility in a developing solution under the action of acid, the component (A) is preferably a polymeric compound described later that generates a base upon exposure and exhibits a changed solubility in a developing solution under the action of acid. As such a polymeric compound, resins having a structural unit that generates a base upon exposure can be used. As the structural units that generate a base upon exposure, a conventional structural unit (for example, those disclosed in Japanese Unexamined Patent Application, First Publication No. 2011-102974) can be given.

In the resist composition of the present invention, the case of (1) or (2) is particularly desirable.

<Base Component (A)>

The resist composition of the present invention includes a base component (A) (hereafter, referred to as "base component (A)") that exhibits increased solubility in an alkali developing solution under the action of acid.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed. The "organic compound having a molecular weight of 500 or more" used as the base component is broadly classified into non-polymers and polymers.

In general, as a non-polymer, any of those which have a molecular weight in the range of 500 to less than 4,000 is used. Hereafter, the term "low molecular weight compound" is used to describe a non-polymer having a molecular weight of at least 500 but less than 4,000.

As a polymer, any of those which have a molecular weight of 1,000 or more is generally used. Hereafter, a polymer having a molecular weight of 1,000 or more is referred to as a polymeric compound. For these polymeric compounds, the "molecular weight" is the weight-average molecular weight in terms of the polystyrene-equivalent value determined by gel permeation chromatography (GPC). Hereafter, a polymeric compound is frequently referred to simply as a "resin".

(Structural Unit (a1))

The base component (A) preferably has a structural unit (a1). The structural unit (a1) contains an acid decomposable group which exhibits increased polarity by the action of an acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—$SO_3H$). Among these, a polar group containing —OH in the structure thereof (hereafter, referred to as "OH-containing polar group") is preferable, a carboxy group or a hydroxy group is more preferable, and a carboxy group is particularly desirable.

Specific examples of the acid decomposable group include groups in which an aforementioned polar group is protected with an acid dissociable group (such as a group in which the hydrogen atom of an OH-containing polar group is protected with an acid dissociable group).

Here, the "acid dissociable group" refers to both:

(i) a group having acid dissociability in which the bond between the acid dissociable group and the adjacent carbon atom can be cleaved by the action of acid; and (ii) a group in which the bond between the acid dissociable group and the adjacent carbon atom can be cleaved by undergoing further decomposition via a decarboxylation reaction following cleavage of some bonds under the action of acid.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A) is increased. By the increase in the polarity, the solubility in a developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Among the above-described polar group, examples of the acid dissociable group protecting a carboxy group or a hydroxy group include an acid dissociable group represented by general formula (a1-r-1) shown below (hereafter, for the sake of simplicity, referred to as "acetal-type acid dissociable group").

[Chemical Formula 1]

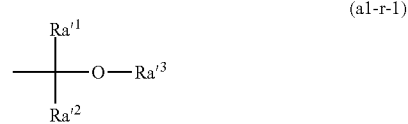

(a1-r-1)

In the formula, each of $Ra'^1$ and $Ra'^2$ independently represents a hydrogen atom or an alkyl group; $Ra'^3$ represents a hydrocarbon group; and $Ra'^3$ may be bonded to either $Ra'^1$ or $Ra'^2$ to form a ring.

In formula (a1-r-1), as the alkyl group for $Ra'^1$ and $Ra'^2$, the same alkyl groups as those described above for the alkyl groups as the substituent which may be bonded to the carbon atom on the α-position of the aforementioned α-position substituted acrylate ester can be used, although a methyl group or ethyl group is preferable, and a methyl group is particularly desirable.

As the hydrocarbon group for $Ra'^3$, an alkyl group of 1 to 20 carbon atoms is preferable, and more preferably an alkyl group of 1 to 10 carbon atoms. As the hydrocarbon group for $Ra'^3$, a linear or branched alkyl group is preferable. Specific examples thereof include a methyl group, an ethyl group, a propyl group, an isopropyl group, an n-butyl group, an isobutyl group, a tert-butyl group, a pentyl group, an isopentyl group, a neopentyl group, 1,1-dimethylethyl group, 1,1-diethylpropyl group, 2,2-dimethylpropyl group and 2,2-dimethylbutyl group.

When $Ra'^3$ is bonded to either $Ra'^1$ or $Ra'^2$ to form a ring, the cyclic group is preferably a 4- to 7-membered ring, and more preferably a 4- to 6-membered ring. Specific examples of the cyclic group include tetrahydropyranyl group and tetrahydrofuranyl group.

Among the above-described polar group, examples of the acid dissociable group protecting a carboxy group include an acid dissociable group represented by general formula (a1-r-2) shown below (among acid dissociable groups represented by following general formula (a1-r-2), hereafter, for the sake of simplicity, an acid dissociable group constituted of alkyl groups is referred to as "tertiary alkyl ester-type acid dissociable group").

[Chemical Formula 2]

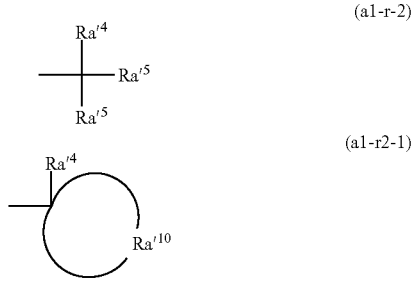

In the formula, $Ra'^4$ to $Ra'^6$ represent a hydrocarbon group, and $Ra'^5$ and $Ra'^6$ may be mutually bonded to form a ring; $Ra'^{10}$ represents a group which forms an aliphatic cyclic group together with a carbon atom having $Ra'^4$ bonded thereto.

As the hydrocarbon group for $Ra'^4$ to $Ra'^6$, the same hydrocarbon group as those described above for the aforementioned hydrocarbon groups in $Ra'^3$ can be given. $Ra'^4$ is preferably an alkyl group of 1 to 5 carbon atoms. When $Ra'^5$ and $Ra'^6$ are be mutually bonded to form a ring, examples thereof include a group represented by general formula (a1-r-1) above. In the formula (a1-r-1), as the aliphatic cyclic group constituted of $Ra'^{10}$, the same groups as those described above for the cyclic alkyl group for $Ra'^3$ in the aforementioned formula (a1-r-1) are preferable.

Further, among the above-described polar group, examples of the acid dissociable group protecting a hydroxy group include an acid dissociable group represented by general formula (a1-r-3) shown below (hereafter, for the sake of simplicity, referred to as "tertiary alkyloxycarbonyl acid dissociable group").

[Chemical Formula 3]

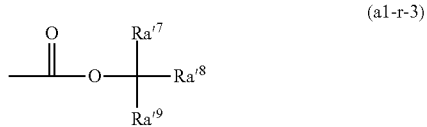

In the formula, $Ra'^7$ to $Ra'^9$ represent an alkyl group.

In formula (a1-r-3), $Ra'^7$ to $Ra'^9$ are preferably an alkyl group of 1 to 5 carbon atoms, and more preferably an alkyl group of 1 to 3 carbon atoms.

In addition, the total number of carbon atoms within the alkyl groups is preferably 3 to 7, more preferably 3 to 5, and most preferably 3 to 4.

Examples of the structural unit (a1) include a structural unit derived from an acrylate ester in which the hydrogen atom bonded to the carbon atom on the α-position may be substituted with a substituent and containing an acid decomposable group that exhibits increased polarity under the action of acid; a structural unit derived from hydroxystyrene or a hydroxystyrene derivative in which at least part of the hydroxyl group hydrogen atoms are protected with a substituent containing the acid decomposable group; and a structural unit derived from vinylbenzoic acid or a vinylbenzoic acid derivative in which at least part of the hydrogen atoms in the —C(=O)—OH moiety within the structural unit are protected with a substituent containing the acid decomposable group.

Of these, the structural unit (a1) is preferably a structural unit derived from an acrylate ester in which the hydrogen atom bonded to the carbon atom on the α-position may be substituted with a substituent.

As the structural unit (a1), a structural unit represented by general formula (a1-1) shown below is preferable.

[Chemical Formula 4]

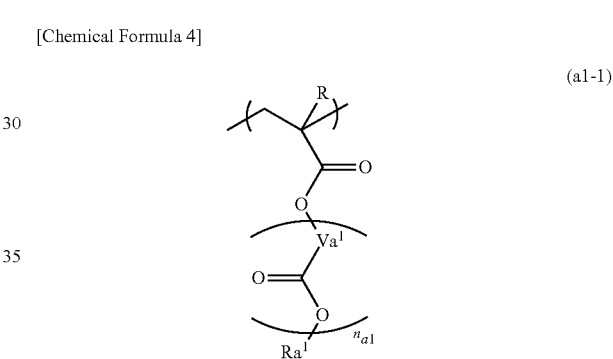

In the formula, R represents a hydrogen atom, an alkyl group of 1 to 5 carbon atoms or a halogenated alkyl group of 1 to 5 carbon atoms; $Va^1$ represents a divalent hydrocarbon group which may have an ether bond, a urethane bond or an amido bond; $n_{a1}$ represents an integer of 0 to 2; and $Ra^1$ represents an acid dissociable group represented by any one of the aforementioned formulas (a1-r-1) to (a1-r-2).

In formula (a1-1), the alkyl group of 1 to 5 carbon atoms is preferably a linear or branched alkyl group of 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group. Examples of the halogenated alkyl group of 1 to 5 carbon atoms include a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The divalent hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as $Va^1$, a group in which the above-mentioned divalent hydrocarbon group is bonded via an ether bond, a urethane bond or an amido bond to can be mentioned.

The linear or branched aliphatic hydrocarbon group preferably has 1 to 10 carbon atoms, more preferably 1 to 6, still more preferably 1 to 4, and most preferably 1 or 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the linear or branched aliphatic hydrocarbon group and a group in which the alicyclic hydrocarbon group is interposed within the linear or branched aliphatic hydrocarbon group, can be given. As examples of the linear or branched aliphatic hydrocarbon group, the same groups as those described above can be given.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 5 to 30 carbon atoms, more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

Specific examples of the aforementioned formula (a1-1) are shown below.

[Chemical Formula 5]

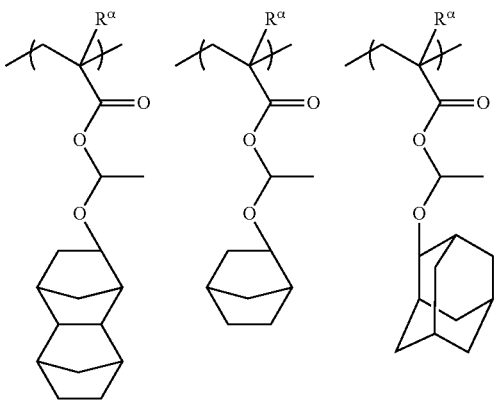

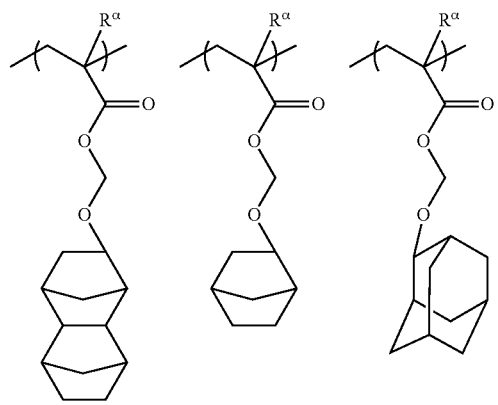

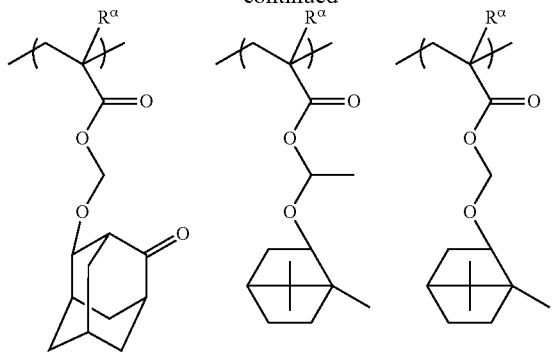
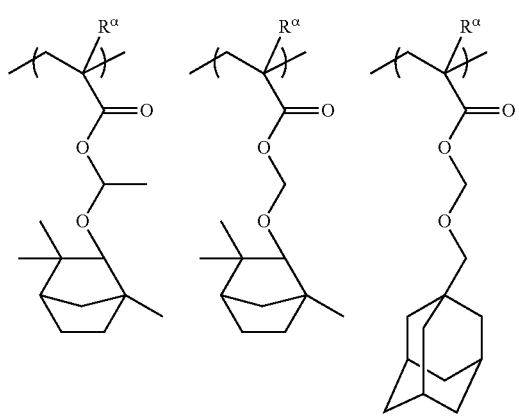
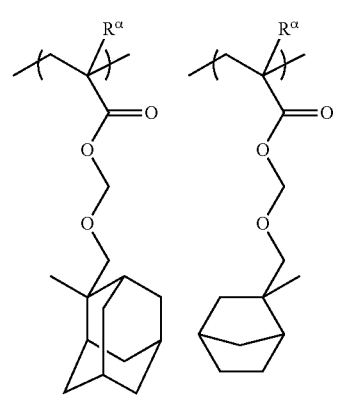
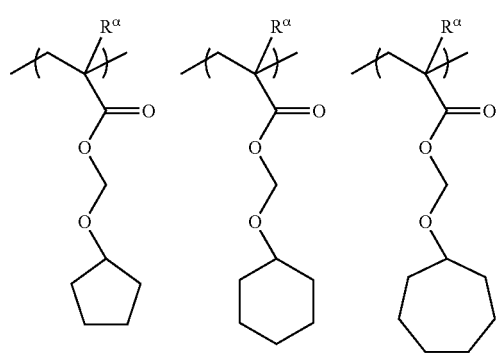
[Chemical Formula 6]
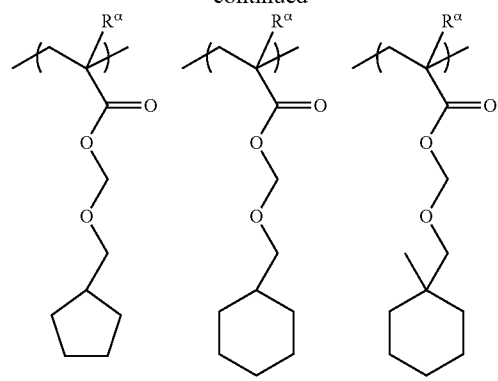
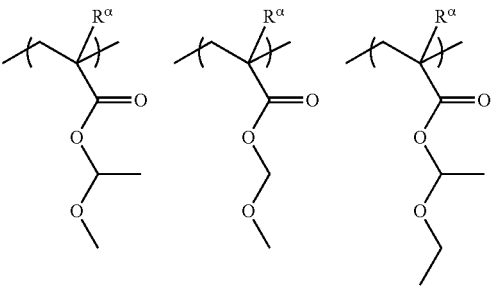
[Chemical Formula 7]
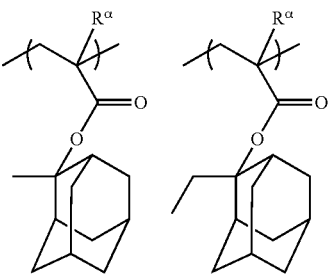
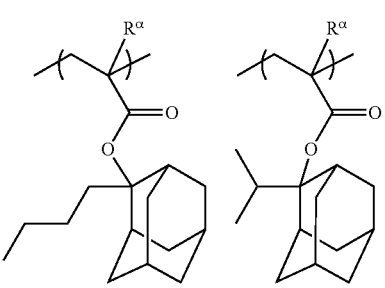

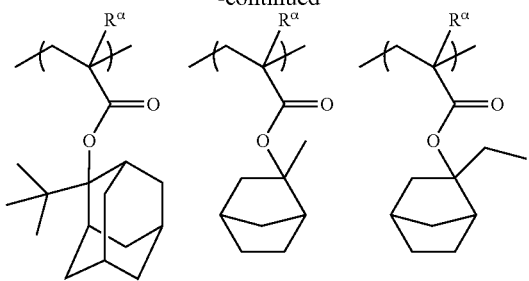
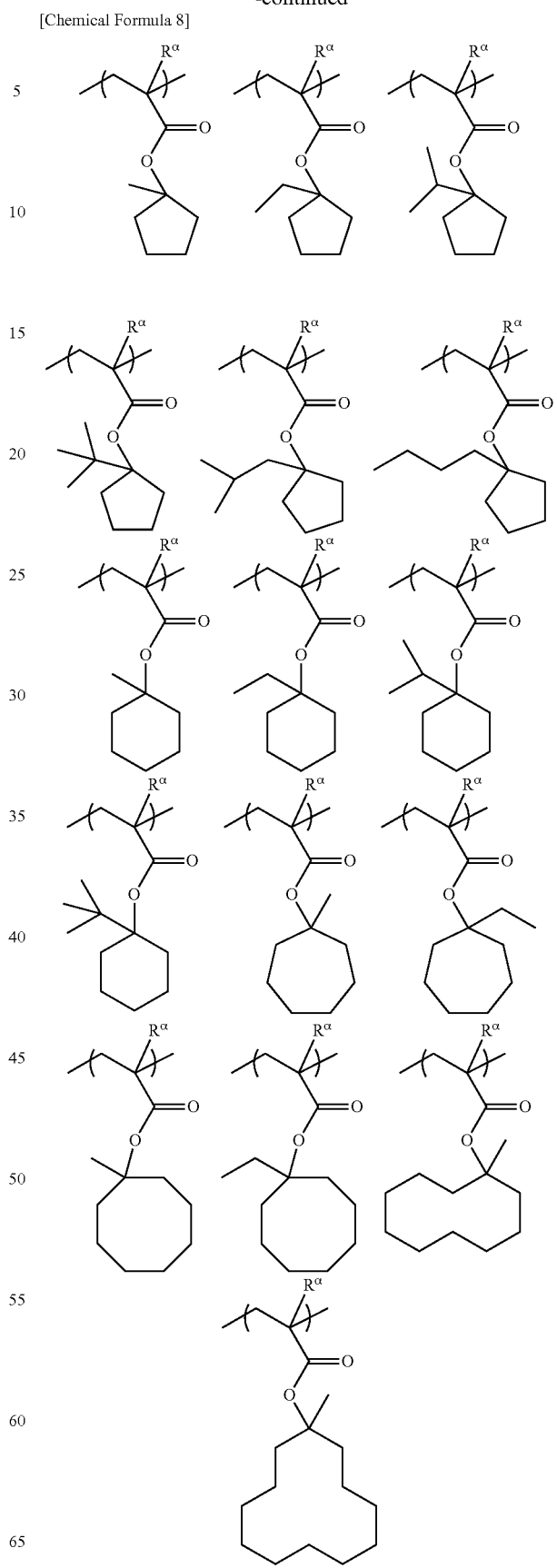
[Chemical Formula 8]

In the component (A), the amount of the structural unit (a1) based on the combined total of all structural units constituting the component (A) is preferably 20 to 80 mol %, more preferably 20 to 75 mol %, and still more preferably 25 to 70 mol %. When the amount of the structural unit (a1) is at least as large as the lower limit of the above-mentioned range, various lithography properties such as sensitivity, resolution, LWR and the like are improved. On the other hand, when the amount of the structural unit (a1) is no more than the upper limit of the above-mentioned range, a good balance can be achieved with the other structural units.

(Structural Unit (a2))

It is preferable that the base component (A) further have a structural unit (a2) which contains a lactone-containing cyclic group.

When the base component (A) is used in forming a resist film, the lactone-containing cyclic group of the structural unit (a2) is effective in improving the adhesion between the resist film and the substrate.

When the structural unit (a1) contains a lactone-containing cyclic group in the structure thereof, the structural unit also falls under the structural unit (a2). However, such a structural unit is regarded as a structural unit (a1), and not as a structural unit (a2).

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

There are no particular limitations on the lactone-containing cyclic group for the structural unit (a2), and an arbitrary structural unit may be used. Specific examples thereof include groups represented by general formulas (a2-r-1) to (a2-r-7) shown below.

[Chemical Formula 9]

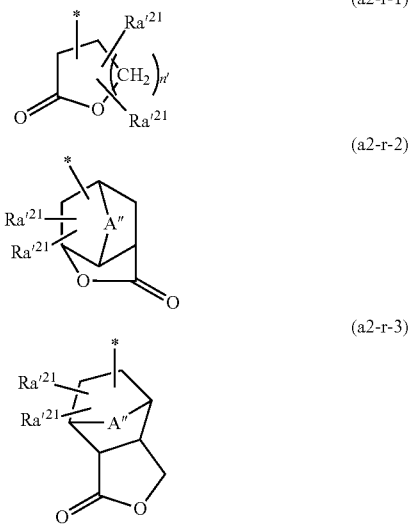

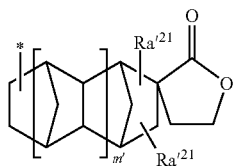

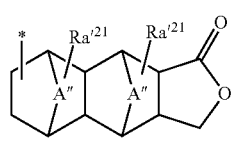

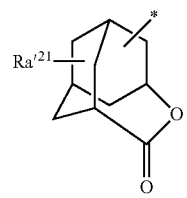

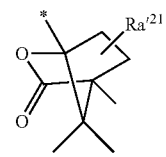

In the formulas, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group, wherein R" represents a hydrogen atom or an alkyl group; A" represents an oxygen atom, a sulfur atom or an alkylene group of 1 to 5 carbon atoms which may contain an oxygen atom or a sulfur atom; n" represents an integer of 0 to 2; and m" represents 0 or 1.

In general formulas (a2-r-1) to (a2-r-7) above, A" represents an oxygen atom (—O—), a sulfur atom (—S—) or an alkylene group of 1 to 5 carbon atoms which may contain an oxygen atom or a sulfur atom. As the alkylene group of 1 to 5 carbon atoms represented by A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—. As A", an alkylene group of 1 to 5 carbon atoms or —O— is preferable, more preferably an alkylene group of 1 to 5 carbon atoms, and most preferably a methylene group. As the alkyl group, alkoxy group, halogen atom, halogenated alkyl group, —COOR", —OC(=O)R" and hydroxyalkyl group for $Ra'^{21}$, the same alkyl groups, alkoxy groups, halogen atoms, halogenated alkyl groups, —COOR", —OC(=O)R" and hydroxyalkyl groups as those described later as the substituent for the aromatic hydrocarbon group of $R^1$ and $R^2$ in formula (C1) can be mentioned.

Specific examples of groups represented by general formulas (a2-r-1) to (a2-r-7) are shown below.

[Chemical Formula 10]
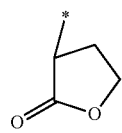 (r-Ic-1-1)
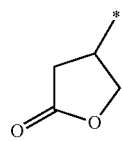 (r-Ic-1-2)
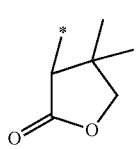 (r-Ic-1-3)
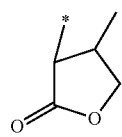 (r-Ic-1-4)
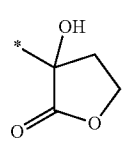 (r-Ic-1-5)
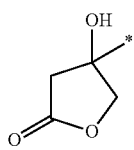 (r-Ic-1-6)
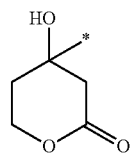 (r-Ic-1-7)
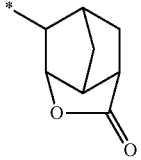 (r-Ic-2-1)
 (r-Ic-2-2)
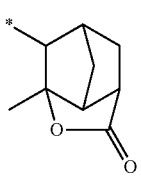 (r-Ic-2-3)
-continued
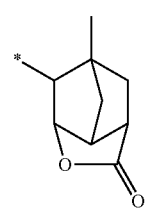 (r-Ic-2-4)
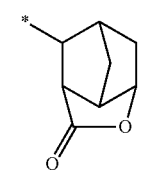 (r-Ic-2-5)
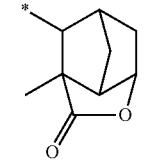 (r-Ic-2-6)
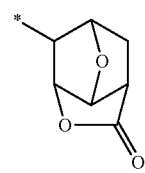 (r-Ic-2-7)
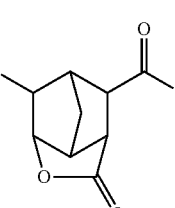 (r-Ic-2-8)
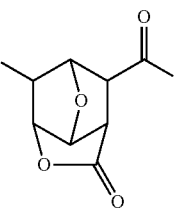 (r-Ic-2-9)
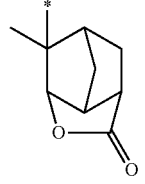 (r-Ic-2-10)
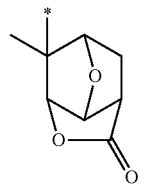 (r-Ic-2-11)

-continued (r-Ic-2-12)
(r-Ic-2-13)
(r-Ic-3-1)
(r-Ic-3-2)
(r-Ic-3-3)
(r-Ic-3-4)
(r-Ic-3-5)
(r-Ic-4-1)

-continued (r-Ic-4-2)
(r-Ic-4-3)
(r-Ic-4-4)
(r-Ic-4-5)
(r-Ic-4-6)
(r-Ic-4-7)
(r-Ic-4-8)
(r-Ic-4-9)
(r-Ic-5-1)

(r-Ic-5-2)

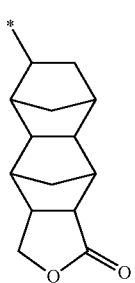

(r-Ic-5-3)

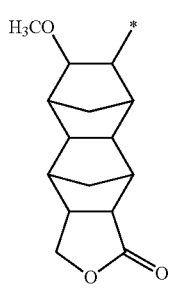

(r-Ic-5-4)

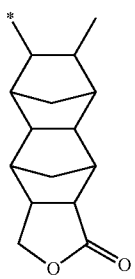

(r-Ic-6-1)

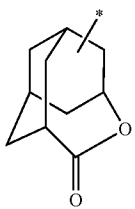

(r-Ic-7-1)

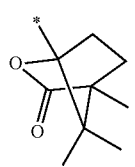

In the structural unit (a2), the structure other than the lactone-containing cyclic group is not particularly limited as long as the structural unit (a2) contains the lactone-containing cyclic group, but examples of the structural unit (a2) include structural units represented by general formula (a2-1) or (a2-2) shown below.

[Chemical Formula 11]

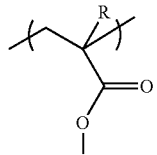

(a2-1)

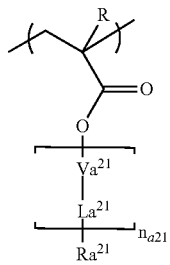

(a2-2)

In the formula, R represents a hydrogen atom, an alkyl group of 1 to 5 carbon atoms or a halogenated alkyl group of 1 to 5 carbon atoms; $Va^{21}$ represents an alkylene group of 1 to 5 carbon atoms; $La^{21}$ represents an ester bond; $na^{21}$ represents 1 or 2; and $Ra^{21}$ represents a group represented by any one of the aforementioned formulas (a2-r-1) to (a2-r-7).

As the alkyl group of R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group of 1 to 5 carbon atoms for R is a group in which part or all of the hydrogen atoms of the aforementioned alkyl group of 1 to 5 carbon atoms has been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

$Va^{21}$ is preferably an alkylene group of 1 to 3 carbon atoms. $La^{21}$ is —C(=O)O— or —O—C(=O)—. When $na^{21}$ is 2, $Va^{21}$ and $La^{21}$ may be different from each other.

Specific examples of structural units represented by the aforementioned general formula (a2-1) or (a2-2) are shown below. In the formulas shown below, $R^{\alpha}$ represents a hydrogen atom, a methyl group or a trifluoromethyl group.

[Chemical Formula 12]

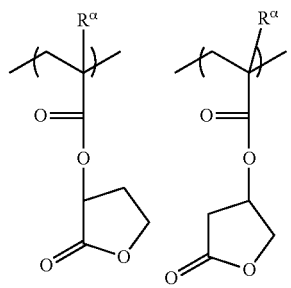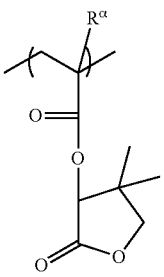

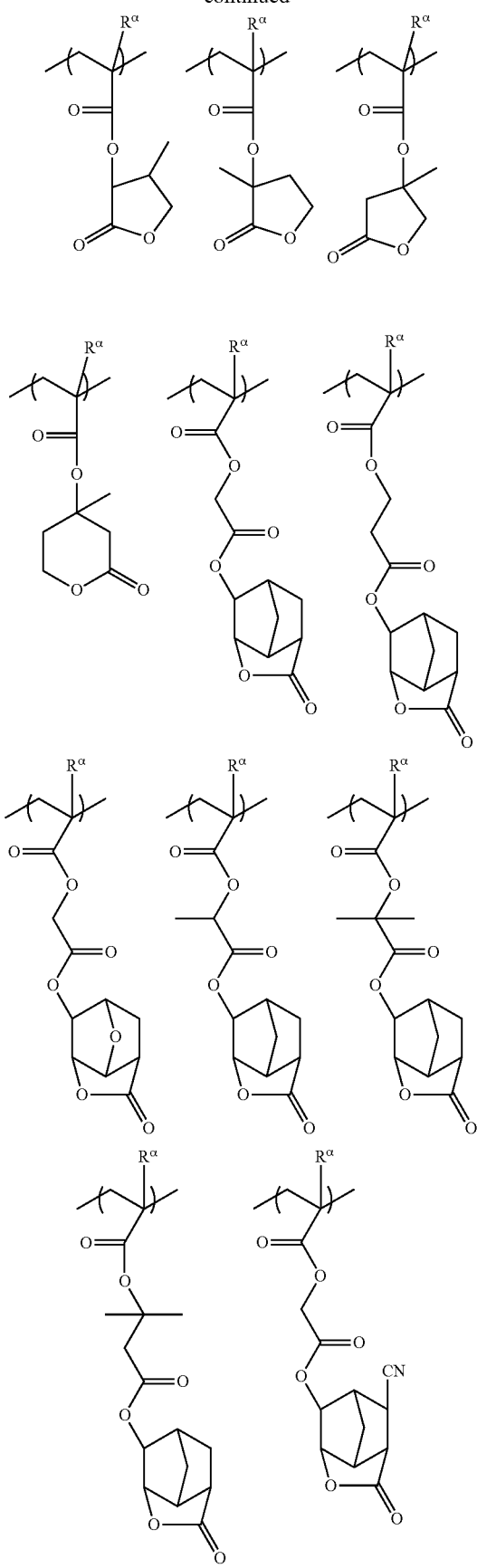

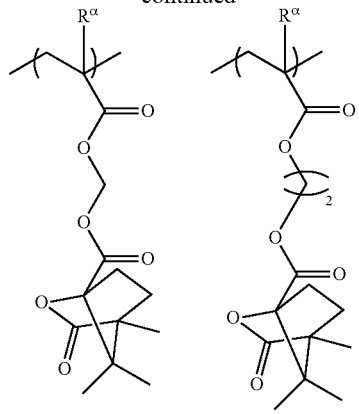

(Structural Unit (a3))

The base component (A) may have a structural unit (a3). The structural unit (a3) contains a polar group-containing aliphatic hydrocarbon group (but excluding structural units that correspond with the aforementioned structural units (a1) and (a2)).

It is thought that when the base component (A) includes the structural unit (a3), the hydrophilicity of the component (A) is improved, which contributes to a favorable improvement in the resolution.

Examples of the polar group include a hydroxyl group, cyano group, carboxy group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxy group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

There are no particular limitations on the structural unit (a3) as long as it contains the polar group-containing aliphatic hydrocarbon group, and an arbitrary structural unit may be used.

The structural unit (a3) is preferably a structural unit derived from an acrylate ester in which the hydrogen atom bonded to the carbon atom on the α-position may be substituted with a substituent and containing a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 13]

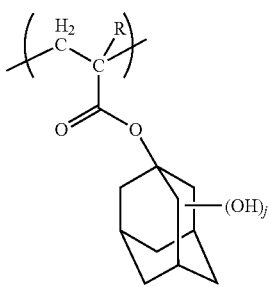
(a3-1)

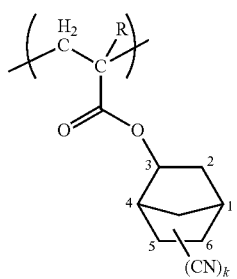
(a3-2)

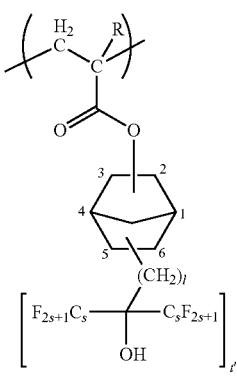
(a3-3)

In the formulas, R is the same as defined above, j represents an integer of 1 to 3, k represents an integer of 1 to 3, t' represents an integer of 1 to 3, l represents an integer of 1 to 5, and s represents an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

The structural unit (a3) contained within the base component (A) may be a single type of structural unit or a combination of two or more types.

The amount of the structural unit (a3) within the base component (A), based on the combined total of all the structural units that constitute the base component (A), is preferably within a range from 5 to 50 mol %, more preferably from 5 to 40 mol %, and still more preferably from 5 and 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

The base component (A) may further have a structural unit (a4) containing a non-acid-dissociable cyclic group as required. When the component (A) has the structural unit (a4), dry etching resistance of resist patterns to be formed is improved, and it is thought that hydrophobicity of the base component (A) is also enhanced. Particularly, when an organic solvent development is used, it is thought that the enhancement of hydrophobicity contributes to improvements in resolution, the shape of the resist pattern and the like.

The term "non-acid-dissociable cyclic group" in the structural unit (a4) refers to a cyclic group that is not dissociated even by the action of acid of a component (G1), thereby remaining in the structural unit without any changes.

Preferable examples of the structural unit (a4) include a structural unit derived from an acrylate ester containing a non-acid-dissociable aliphatic polycyclic group. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Further, preferable examples of the structural unit (a4) also include a structural unit derived from an acrylate ester containing a non-acid-dissociable aromatic group, a structural unit derived from a styrene, and a structural unit derived from a hydroxystyrene.

Specific examples of the structural unit (a4) include structural units having structures represented by general formulas (a4-1) to (a4-7) shown below, a vinyl(hydroxynaphthalene), a hydroxynaphthyl (meth)acrylate and a hydroxybenzyl (meth)acrylate.

[Chemical Formula 14]

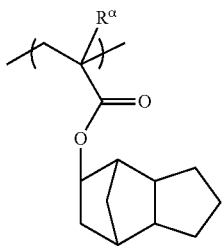
(a4-1)

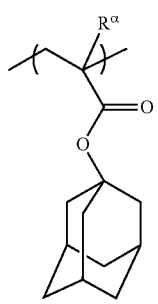
(a4-2)

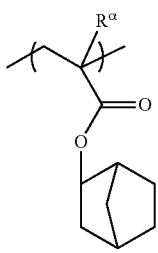
(a4-3)

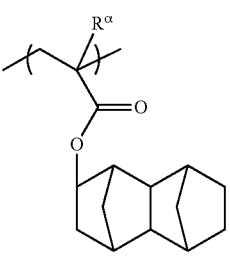
(a4-4)

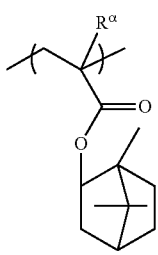
(a4-5)

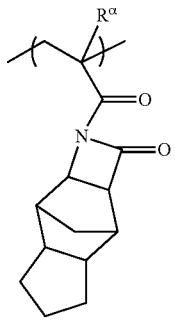
(a4-6)

(a4-7)

In the formulas, $R^\alpha$ represents a hydrogen atom, a methyl group or a trifluoromethyl group.

When the structural unit (a4) is included in the base component (A), the amount of the structural unit (a4), based on the combined total of all the structural units that constitute the base component (A), is preferably within a range from 1 to 30 mol %, and more preferably from 10 to 20 mol %.

(Structural Unit (a5))

It is preferable that the base component (A) further have a structural unit (a5) which contains a —$SO_2$— containing cyclic group.

The "—$SO_2$— containing cyclic group" which may be contained in the base component (A) refers to a cyclic group having a ring containing —$SO_2$— within the ring structure thereof, i.e., a cyclic group in which the sulfur atom (S) within —$SO_2$— forms part of the ring skeleton of the cyclic group. The ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable. More specific examples of the —$SO_2$— containing cyclic group include groups represented by general formulas (a5-r-1) to (a5-r-4) shown below.

[Chemical Formula 15]

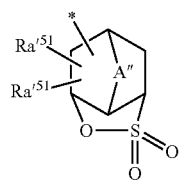
(a5-r-1)

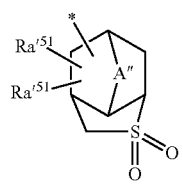
(a5-r-2)

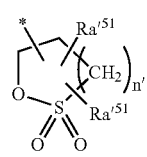
(a5-r-3)

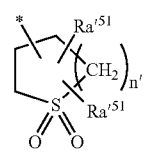
(a5-r-4)

In the formulas, each $Ra'^{51}$ independently represents a hydrogen atom, an alkyl group, an alkoxy group, a halogen atom, a halogenated alkyl group, a hydroxy group, —COOR"—OC(=O)R", a hydroxyalkyl group or a cyano group, wherein R" represents a hydrogen atom or an alkyl group; A" represents an oxygen atom, a sulfur atom or an alkylene group of 1 to 5 carbon atoms which may contain an oxygen atom or a sulfur atom; and n' represents an integer of 0 to 2.

In general formulas (a5-r-1) to (a5-r-4), A" is the same as defined for A" in general formulas (a2-r-1) to (a2-r-7). The alkyl group, alkoxy group, halogen atom, halogenated alkyl group, —COOR", —OC(=O)R" and hydroxyalkyl group for $Ra'^{51}$ are the same as defined for $Ra'^{21}$ in the aforementioned general formulas (a2-r-1) to (a2-r-7).

Specific examples of groups represented by general formulas (a5-r-1) to (a5-r-4) are shown below. In the formulas shown below, "Ac" represents an acetyl group.

[Chemical Formula 16]

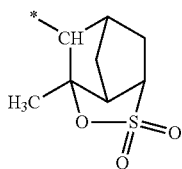
(rsI-1-1)

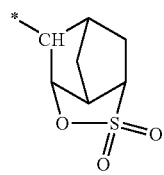
(r-sI-1-2)

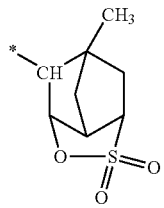
(r-sI-1-3)

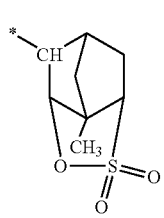
(r-sI-1-4)

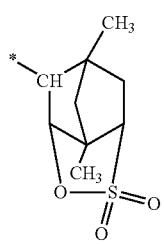
(r-sI-1-5)

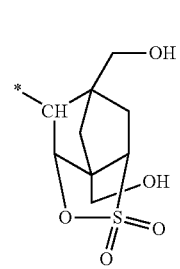
(r-sI-1-6)

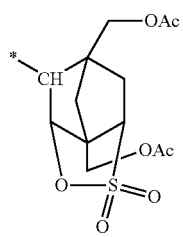
(r-sI-1-7)

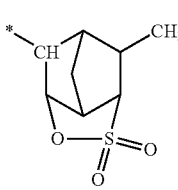
(r-sI-1-8)

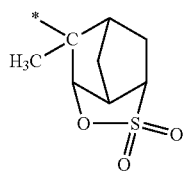
(r-sI-1-9)

(r-sI-1-10) 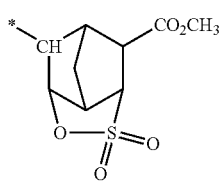
(r-sI-1-11) 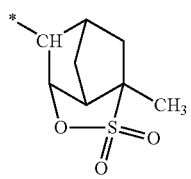
(r-sI-1-12) 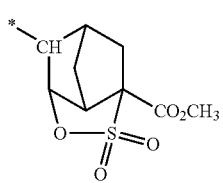
(r-sI-1-13) 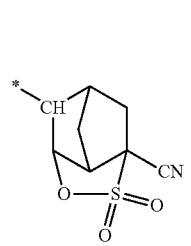
(r-sI-1-14) 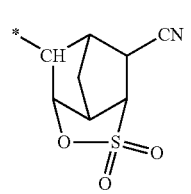
(r-sI-1-15) 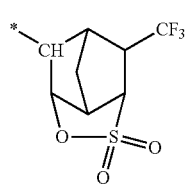
(r-sI-1-16) 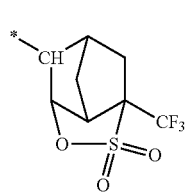
(r-sI-1-17) 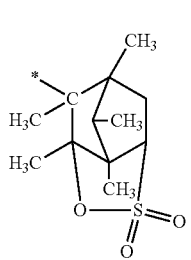
(r-sI-1-18) 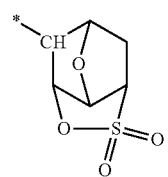
(r-sI-1-19) 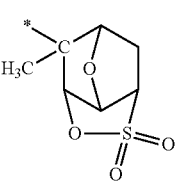
(r-sI-1-20) 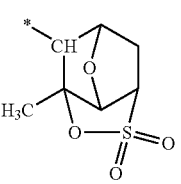
(r-sI-1-21) 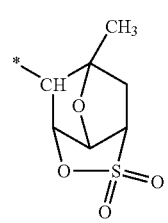
[Chemical Formula 17]
(r-sI-1-22) 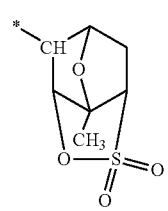
(r-sI-1-23) 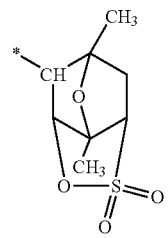
(r-sI-1-24) 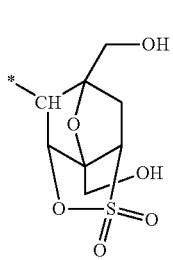

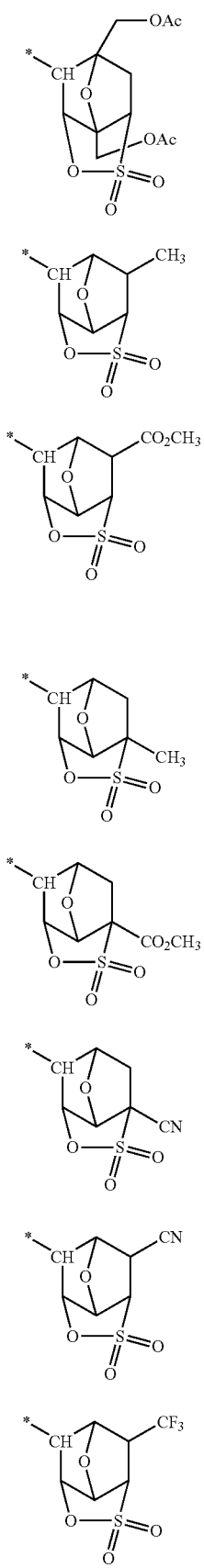

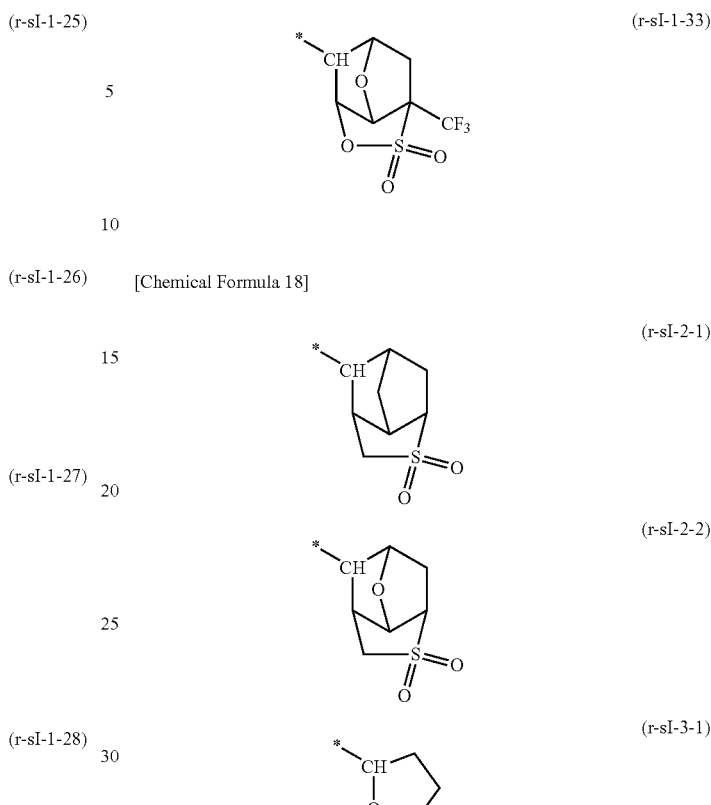

[Chemical Formula 18]

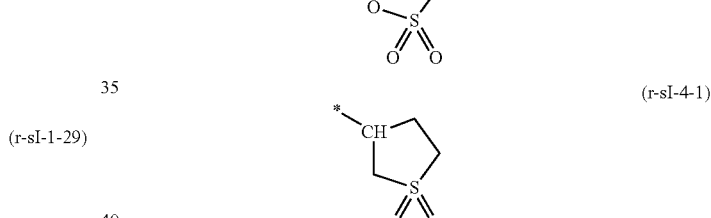

In the structural unit (a5), the structure other than the —$SO_2$— containing cyclic group is not particularly limited as long as the structural unit (a5) contains the —$SO_2$— containing cyclic group, but a structural unit in which $Ra^{21}$ of the aforementioned general formula (a2-1) or (a2-2) is a group represented by any one of general formulas (a5-r-1) to (a5-r-4) above can be mentioned.

Of the groups shown above, the —$SO_2$-containing cyclic group is preferably a group represented by general formula (a5-r-1), (a5-r-3) or (a5-r-4), more preferably at least one group selected from the group consisting of groups represented by the above chemical formulas (r-sl-1-1), (r-sl-1-18), (r-sl-3-1) and (r-sl-4-1), and most preferably a group represented by the chemical formula (r-sl-1-1).

(Structural Unit (a15))

When the component (A) generates a base upon exposure, the component (A) has a structural unit (a15) that generates a base upon exposure. As the structural unit (a15), any of these known compounds can be selected, although the component (A) preferably has the structural unit (a15-1) represented by general formula (a15-1) shown below. It is thought to contribute improvement in resolution because the structural unit (a15-1) generates a base upon exposure.

[Chemical Formula 19]

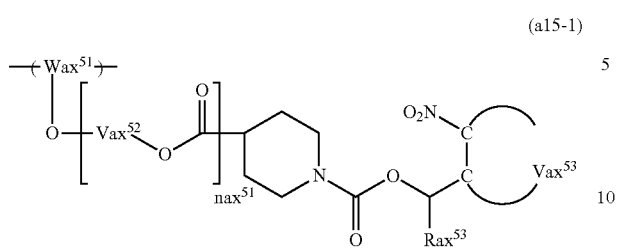

(a15-1)

In the formula, $Wax^{51}$ represents a group formed from a group containing a polymerizable group by a polymerization reaction; $Vax^{52}$ represents an alkylene group which may have a substituent; $Rax^{53}$ represents a hydrogen atom or a hydrocarbon group which may have a substituent; $Vax^{53}$ represents a group which forms an aromatic ring with two carbon atoms to which $Vax^{53}$ is bonded, wherein the aromatic ring may further have a nitro group or a substituent other than a nitro group in addition of the nitro group which has bonded thereto; and $nax^{51}$ represents 0 or 1.

In general formula (a15-1), $Wax^{51}$ represents a group formed from a group containing a polymerizable group by a polymerization reaction.

A "polymerizable group" refers to a group enabling the compound having the polymerizable group to polymerize by radical polymerization or the like, and refers to a group including a multiple bond among carbon atoms, for example, such as an ethylenic double bond.

Examples of the polymerizable group include a vinyl group, allyl group, acryloyl group, methacryloyl group, fluorovinyl group, difluorovinyl group, trifluorovinyl group, difluorotrifluoromethylvinyl group, trifluoroallyl group, perfluoroallyl group, trifluoromethylacryloyl group, nonylfluorobutylacryloyl group, vinyl ether group, fluorine-containing vinyl ether group, allyl ether group, fluorine-containing allyl ether group, styryl group, vinylnaphthyl group, fluorine-containing styryl group, fluorine-containing vinylnaphthyl group, norbornyl group, fluorine-containing norbornyl group, and silyl group. $Vax^{52}$ is an alkylene group which may have a substituent, and examples thereof include a linear, branched or cyclic alkylene group of 1 to 20 carbon atoms or an alkylene group formed by combination thereof. As the linear, branched or cyclic alkylene group of 1 to 20 carbon atoms, 2 to 10 carbon atoms are preferable. Examples of substituents include a monovalent group such as an alkyl group of 1 to 5 carbon atoms, an alkoxy group of 1 to 5 carbon atoms, a hydroxy group, thiol group, amino group and phenyl group, or a group in which the monovalent group is combined with a divalent group such as an ether bond and phenylene group.

The hydrocarbon group which may have a substituent for $Rax^{53}$ is the same as defined for $Rk^{11}$ described later. Preferable examples of $Rax^{53}$ include a nitrophenyl group or a hydrogen group.

As the group which forms an aromatic ring with two carbon atoms to which $Vax^{53}$ is bonded, a phenyl group or a naphthyl group is preferable. $nax^{51}$ is preferably 1 in terms of improvement in resolution.

Specific examples of structural units represented by the formula (a15-1) are shown below. In the formulas shown below, $R^{\alpha}$ represents a hydrogen atom, a methyl group or a trifluoromethyl group.

[Chemical Formula 20]

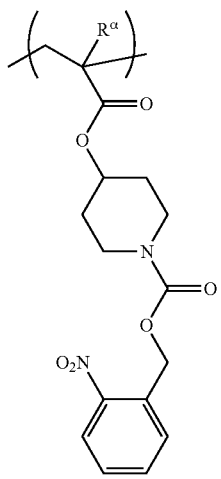

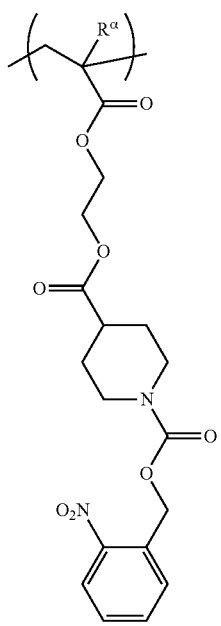

37
-continued
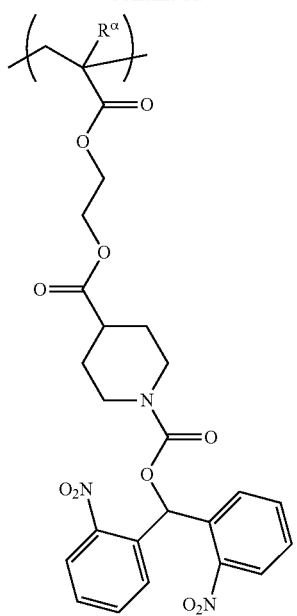
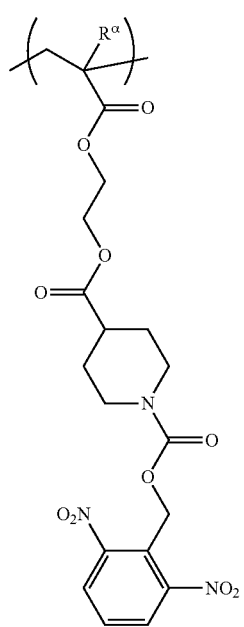
38
-continued
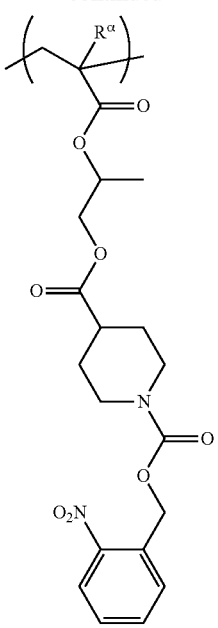
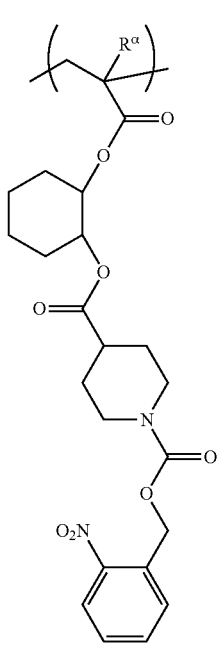

-continued

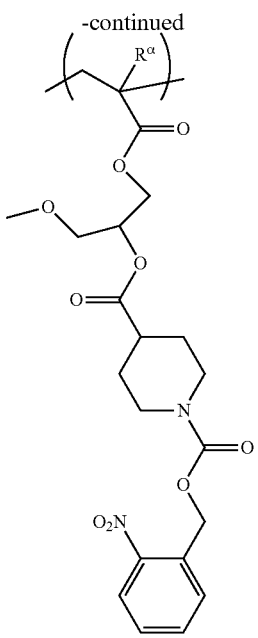

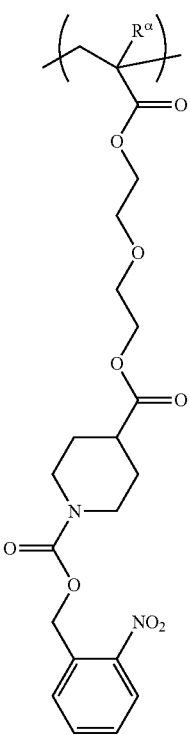

The base component (A) can be obtained, for example, by a conventional radical polymerization or the like of the monomers corresponding to each structural unit, using a radical polymerization initiator such as azobisisobutyronitrile (AIBN) and dimethyl 2,2'-azobis(isobutyrate).

Further, in the base component (A), by using a chain transfer agent such as HS—$CH_2$—$CH_2$—$CH_2$—$C(CF_3)_2$—OH, a —$C(CF_3)_2$—OH group can be introduced at the terminals of the base component (A). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the base component (A) is not particularly limited, but is preferably 1,000 to 50,000, more preferably 1,500 to 30,000, and most preferably 2,000 to 20,000. When the weight average molecular weight is not more than the upper limit of the above range, the base component (A) exhibits satisfactory solubility in a resist solvent when used in a resist composition. On the other hand, when the weight average molecular weight is at least as large as the lower limit of the above range, the dry etching resistance and the cross-sectional shape of the resist pattern are improved.

The dispersity (Mw/Mn) is not particularly limited, but is preferably 1.0 to 5.0, more preferably 1.0 to 3.0, and most preferably 1.0 to 2.5. Here, Mn is the number average molecular weight.

As the base component (A), one type may be used alone, or two or more types may be used in combination.

In the resist composition of the present invention, the amount of the base component (A) can be appropriately adjusted depending on the thickness of the resist film to be formed, and the like.

<Component (C)>

In the resist composition of the present invention, when the component (A) has no structural unit that generates a base upon exposure, the resist composition preferably includes a photo-base generator component (C) (hereafter, referred to as "component (C)".

The component (C) may be any compound capable of being decomposed by irradiation of radiation to generate a base, and examples thereof include a compound containing a carbamate group (a urethane bond), a compound containing an acyloxyimino group, an ionic compound (an anion-cation complex), and a compound containing a carbamoyloxyimino group. Among these, a compound containing a carbamate group (a urethane bond), a compound containing an acyloxyimino group, and an ionic compound (an anion-cation complex) are preferable.

Further, compounds having a ring structure within a molecule thereof are preferable, and examples thereof include compounds having a ring skeleton such as benzene, naphthalene, anthracene, xanthone, thioxanthone, anthraquinone or fluorene.

Among these, as the component (C), in terms of photodegradability, a compound represented by general formula (C1) shown below (hereafter, referred to as "component (C1)") is particularly desirable. When the compound is irradiated by radiation, at least the bond between the nitrogen atom in the formula (C1) and the carbon atom of the carbonyl group adjacent to the nitrogen atom is cleaved, thereby generating an amine or ammonia and carbon dioxide. At this time, after the decomposition, since the product contains —$N(R^1)(R^2)$, which has a high boiling point, the product can be prevented from vaporizing by the baking (PEB). Accordingly, since the degree of freedom in selecting the baking temperature is enhanced, it is preferable that the product containing —$N(R^1)(R^2)$ have a high boiling point. Further, in terms of suppressing diffusion of a base during PEB, it is preferable that the product containing —$N(R^1)(R^2)$ has a large molecular weight or a highly bulky skeleton.

[Chemical Formula 21]

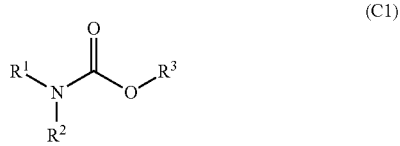
(C1)

In the formula, $R^1$ and $R^2$ each independently represents a hydrogen atom or a monovalent hydrocarbon group which may contain a hetero atom, provided that $R^1$ and $R^2$ may be mutually bonded to form a cyclic group with the adjacent nitrogen atom; and $R^3$ represents a monovalent photoactive group.

In formula (C1), the hetero atom which may be contained in the hydrocarbon group for $R^1$ and $R^2$ is an atom other than hydrogen and carbon, and examples thereof include an oxygen atom, a nitrogen atom, a sulfur atom and a halogen atom. Examples of the halogen atom include a fluorine atom, a chlorine atom, a bromine atom and an iodine atom.

The hydrocarbon group may be either an aromatic hydrocarbon group or an aliphatic hydrocarbon group, although the hydrocarbon group is preferably an aliphatic hydrocarbon group.

In general formula (C1) above, the aromatic hydrocarbon group for $R^1$ and $R^2$ is a hydrocarbon group having an aromatic ring.

The aromatic hydrocarbon group for $R^1$ and $R^2$ preferably has 5 to 30 carbon atoms, more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of the aromatic hydrocarbon group include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

Further, when the aromatic hydrocarbon group has an aliphatic hydrocarbon group bonded to the aromatic ring, part of the carbon atoms constituting the aliphatic hydrocarbon group may be substituted with a divalent linking group containing a hetero atom, or part or all of the hydrogen atoms constituting the aliphatic hydrocarbon group may be substituted with a substituent group. As examples of the "aliphatic hydrocarbon group" and the "divalent linking group containing a hetero atom", the same aliphatic hydrocarbon groups and divalent linking groups containing a hetero atom as those described later for $R^1$ and $R^2$ can be mentioned.

Examples of the aromatic hydrocarbon group in which part of the carbon atoms constituting the aromatic ring has been substituted with a hetero atom include a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom.

Examples of the substituent group which substitutes the hydrogen atom bonded to the aromatic ring of the aforementioned aromatic hydrocarbon group include an alkyl group, an alkoxy group, a halogen atom, a halogenated alkyl group, a hydroxyalkyl group, a hydroxy group, an oxygen atom (=O), —COOR", —OC(=O)R", a cyano group, a nitro group, —NR"$_2$, —R$^{9'}$—N(R$^{10'}$)—C(=O)—O—R$^{5'}$, and a nitrogen-containing heterocyclic group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for the substituent is preferably an alkoxy group of 1 to 6 carbon atoms.

The alkoxy group is preferably a linear or branched group. Specific examples include groups in which an oxygen atom (—O—) is bonded to any of the alkyl groups described above as the substituent.

Examples of the halogen atom for the substituent include a fluorine atom, a chlorine atom, a bromine atom and an iodine atom, and a fluorine atom is preferable.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

The hydroxyalkyl group for the substituent preferably has 1 to 6 carbon atoms, and specific examples thereof include the aforementioned alkyl groups for the substituent in which at least one hydrogen atom has been substituted with a hydroxy group.

In the —COOR" group, the —OC(=O)R" group and the —NR"$_2$ group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The two R" groups within the —NR"$_2$ group may be the same or different from each other.

In formula —$R^{9'}$—N($R^{10'}$)—C(=O)—O—$R^{5'}$, $R^{9'}$ represents a divalent hydrocarbon group which may contain a hetero atom, $R^{10'}$ represents a hydrogen atom or a monovalent hydrocarbon group which may contain a hetero atom, and $R^{5'}$ represents a monovalent organic group which has an aliphatic ring or an aromatic ring.

Examples of the hydrocarbon group for $R^{9'}$ include groups in which one hydrogen atom has been removed from the hydrocarbon group for $R^1$ in the aforementioned formula (C1).

As examples of $R^{10'}$ and $R^{5'}$, the same groups as those described above for $R^2$ and $R^3$ in formula (C1) can be given, respectively.

In formula —$R^{9'}$—N($R^{10'}$)—C(=O)—O—$R^{5'}$, $R^{10'}$ may be bonded to $R^{9'}$ to form a ring.

With respect to $R^1$ and $R^2$ in general formula (C1) above, when $R^1$ has —$R^{9'}$—N($R^{10'}$)—C(=O)—O—$R^{5'}$ as a substituent, $R^{10'}$ may be bonded to $R^2$ in formula (C1) to form a ring.

With respect to $R^1$ and $R^2$ in general formula (C1) above, when $R^1$ has —$R^{9'}$—N($R^{10'}$)—C(=O)—O—$R^{5'}$ as a substituent, the compound represented by formula (C1) is preferably a compound represented by the following general formula: $R^{5'}$—O—C(=O)—N($R^{10'}$)—$R^4$—N($R^2$)—C(=O)—O—$R^3$ [in the formula, $R^2$, $R^3$, $R^{10'}$ and $R^{5'}$ are the same as defined above; and $R^4$ represents a divalent aliphatic hydrocarbon group].

Examples of the divalent aliphatic hydrocarbon group for $R^4$ include groups in which one hydrogen atom has been removed from the aliphatic hydrocarbon groups for $R^1$ and $R^2$ described later.

The "nitrogen-containing heterocyclic group" as the aforementioned substituent is a group in which one or more hydrogen atoms have been removed from a nitrogen-containing heterocyclic compound containing a nitrogen atom in the ring skeleton thereof. The nitrogen-containing heterocyclic compound may have a carbon atom or a hetero atom other than nitrogen (e.g., an oxygen atom, a sulfur atom or the like) within the ring skeleton thereof.

The nitrogen-containing heterocyclic compound may be either aromatic or aliphatic. When the nitrogen-containing heterocyclic compound is aliphatic, it may be either saturated or unsaturated. Further, the nitrogen-containing heterocyclic compound may be either monocyclic or polycyclic.

The nitrogen-containing heterocyclic compound preferably has 3 to 30 carbon atoms, more preferably 5 to 30, and still more preferably 5 to 20.

Specific examples of monocyclic nitrogen-containing heterocyclc compound include pyrrole, pyridine, imidazole, pyrazole, 1,2,3-triazole, 1,2,4-triazole, pyrimidine, pyrazine, 1,3,5-triazine, tetrazole, piperidine, piperazine, pyrrolidine and morpholine.

Specific examples of polycyclic nitrogen-containing heterocyclc compound include quinoline, isoquinoline, indole, pyrrolo[2,3-b]pyridine, indazole, benzimidazole, benzotriazole, carbazole, acridine, 1,5-diazabicyclo[4.3.0]-5-nonene, 1,8-diazabicyclo[5.4.0]-7-undecene, hexamethylenetetramine and 1,4-diazabicyclo[2.2.2]octane.

The nitrogen-containing heterocyclic compound may have a substituent. Examples of the substituent include the same groups as those described above for the substituent group which substitutes a hydrogen atom bonded to the aromatic ring contained in the aforementioned aromatic hydrocarbon group.

In general formula (C1) above, the aliphatic hydrocarbon group for $R^1$ and $R^2$ refers to a hydrocarbon group that has no aromaticity.

The aliphatic hydrocarbon group for $R^1$ and $R^2$ may be either saturated (an alkyl group) or unsaturated. In general, the aliphatic hydrocarbon group is preferably saturated. Further, the aliphatic hydrocarbon group may be linear, branched or cyclic, or a combination thereof. Examples of the combination include a group in which a cyclic aliphatic hydrocarbon group is bonded to a terminal of a linear or branched aliphatic hydrocarbon group, and a group in which a cyclic aliphatic hydrocarbon group is interposed within a linear or branched aliphatic hydrocarbon group.

The linear or branched alkyl group preferably has 1 to 20 carbon atoms, more preferably 1 to 15, and still more preferably 1 to 10.

Specific examples of linear alkyl groups include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

Specific examples of branched alkyl groups include a 1-methylethyl group (an isopropyl group), a 1-methylpropyl group, a 2-methylpropyl group, a 1-methylbutyl group, a 2-methylbutyl group, a 3-methylbutyl group, a 1-ethylbutyl group, a 2-ethylbutyl group, a tert-butyl group, a 1-methylpentyl group, a 2-methylpentyl group, a 3-methylpentyl group and a 4-methylpentyl group.

The cyclic alkyl group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12. As the aliphatic cyclic group, a group in which one hydrogen atom has been removed from a monocycloalkane or a polycycloalkane such as a bicycloalkane, tricycloalkane or tetracycloalkane can be used. Specific examples of the group in which one hydrogen atom has been removed from a monocycloalkane include a cyclopentyl group and a cyclohexyl group. Examples of the group in which one hydrogen atom has been removed from a polycycloalkane include an adamantyl group, a norbornyl group, an isobornyl group, a tricyclodecyl group and a tetracyclododecyl group.

The aliphatic hydrocarbon group may have a substituent. For example, part of the carbon atoms constituting the aliphatic hydrocarbon group may be replaced by a divalent linking group containing a hetero atom, and part or all of the hydrogen atoms constituting the aliphatic hydrocarbon group may be substituted with a substituent.

With respect to the divalent linking group containing a hetero atom, examples of hetero atoms include the same hetero atoms as those described above which replaces part of the carbon atoms constituting the aromatic ring contained in the aforementioned aromatic hydrocarbon group. Examples of the divalent linking group containing a hetero atom include divalent non-hydrocarbon groups containing a hetero atom, such as —O—, —C(=O)—, —C(=O)—O—, a carbonate bond (—O—C(=O)—O—), —S—, —S(=O)$_2$, —S(=O)$_2$—O—, —NH—, —NR$^{04}$—(R$^{04}$ represents a substituent such as an alkyl group or an acyl group), —NH—C(=O)— and =N—. Further, a combination of any one of these "divalent non-hydrocarbon groups containing a hetero atom" with a divalent aliphatic hydrocarbon group can also be used. Examples of the divalent aliphatic hydrocarbon group include groups in which one hydrogen atom has been removed from the aforementioned aliphatic hydrocarbon group, and a linear or branched aliphatic hydrocarbon group is preferable.

As the substituent for the aliphatic hydrocarbon group in the latter example, the same groups as those described above for the substituent group which substitutes a hydrogen atom bonded to the aromatic ring contained in the aforementioned aromatic hydrocarbon group can be mentioned.

In the aforementioned general formula (C1), $R^1$ and $R^2$ may be mutually bonded to form a cyclic group with the adjacent nitrogen atom.

The cyclic group may be either an aromatic cyclic group or an aliphatic cyclic group. When the cyclic group is an aliphatic cyclic group, it may be either saturated or unsaturated. In general, the aliphatic cyclic group is preferably saturated.

The cyclic group may have a nitrogen atom other than the nitrogen atom bonded to $R^1$ and $R^2$ within the ring skeleton thereof. Further, the cyclic group may have a carbon atom or a hetero atom other than nitrogen (e.g., an oxygen atom, a sulfur atom or the like) within the ring skeleton thereof.

The cyclic group may be either a monocyclic group or a polycyclic group.

When the cyclic group is monocyclic, the number of atoms constituting the skeleton of the cyclic group is preferably from 4 to 7, and more preferably 5 or 6. That is, the cyclic group is preferably a 4- to 7-membered ring, and more preferably a 5- or 6-membered ring. Specific examples of monocyclic groups include groups in which the hydrogen atom of —NH— has been removed from a heteromonocyclic group containing —NH— in the ring structure thereof, such as piperidine, pyrrolidine, morpholine, pyrrole, imidazole, pyrazole, 1,2,3-triazole, 1,2,4-triazole, tetrazole or piperazine.

When the cyclic group is polycyclic, the cyclic group is preferably bicyclic, tricyclic or tetracyclic. Further, the number of atoms constituting the skeleton of the cyclic group is preferably from 7 to 12, and more preferably from 7 to 10. Specific examples of polycyclic nitrogen-containing heterocyclic groups include groups in which the hydrogen atom of —NH— has been removed from a heteropolycyclic group containing —NH— in the ring structure thereof, such as indole, isoindole, carbazole, benzimidazole, indazole or benzotriazole.

The cyclic group may have a substituent. Examples of the substituent include the same groups as those described above for the substituent group which substitutes a hydrogen atom bonded to the aromatic ring contained in the aforementioned aromatic hydrocarbon group.

As a cyclic group formed by $R^1$ and $R^2$ mutually bonded with the adjacent nitrogen atom, a group represented by general formula (II) shown below is particularly desirable.

[Chemical Formula 22]

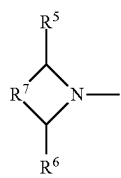

(II)

In the formula, $R^3$ and $R^6$ each independently represents a hydrogen atom or an alkyl group; $R^7$ represents a linear alkylene group of 1 to 3 carbon atoms which may have a carbon atom substituted with an oxygen atom or a nitrogen atom and may have a hydrogen atom substituted with a substituent.

In general formula (II) above, as the alkyl group for $R^5$ and $R^6$, the same alkyl groups as those described above as the aliphatic hydrocarbon group for $R^1$ and $R^2$ can be mentioned, a linear or branched alkyl group is preferable, and a methyl group is particularly desirable.

Examples of the alkylene group for $R^7$ which may have a carbon atom substituted with an oxygen atom or a nitrogen atom include —$CH_2$—, —$CH_2$—O—, —$CH_2$—NH—, —$CH_2$—$CH_2$—, —$CH_2$—O—$CH_2$—, —$CH_2$—NH—$CH_2$—, —$CH_2$—$CH_2$—$CH_2$—, —$CH_2$—$CH_2$—O—$CH_2$—, and —$CH_2$—$CH_2$—NH—$CH_2$—.

As the substituent which substitutes a hydrogen atom in the alkylene group, the same groups as those described above for the substituent group which substitutes a hydrogen atom bonded to the aromatic ring contained in the aforementioned aromatic hydrocarbon group can be mentioned. The hydrogen atom to be substituted with a substituent may be a hydrogen atom bonded to a carbon atom, or a hydrogen atom bonded to a nitrogen atom.

In general formula (C1) above, $R^3$ represents a monovalent photoactive group.

The term "photoactive group" refers to a group which absorbs the exposure energy of the exposure conducted in step (2).

As the photoactive group, a ring-containing group is preferable, and may be either a hydrocarbon ring or a hetero ring. Preferable examples thereof include groups having a ring structure described above for $R^1$ and $R^2$, and groups having an aromatic ring. Specific examples of preferable ring skeletons for the ring-containing group include benzene, biphenyl, indene, naphthalene, fluorene, anthracene, phenanthrene, xanthone, thioxanthone and anthraquinone.

Further, these ring skeletons may have a substituent. In terms of efficiency in the generation of a base, as the substituent, a nitro group is particularly desirable.

As the component (C1), a compound represented by general formula (C1-11) or (C1-12) shown below is particularly desirable.

[Chemical Formula 23]

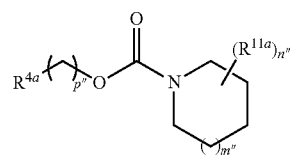

(C1-11)

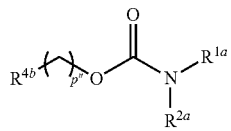

(C1-12)

In the formulas, $R^{4a}$ and $R^{4b}$ each independently represents a ring skeleton selected from benzene, biphenyl, indene, naphthalene, fluorene, anthracene, phenanthrene, xanthone, thioxanthone and anthraquinone which may have a substituent; $R^{1a}$ and $R^{2a}$ each independently represents an alkyl group of 1 to 15 carbon atoms or a cycloalkyl group; $R^{11a}$ represents an alkyl group of 1 to 5 carbon atoms; m" represents 0 or 1; n" represents 0 to 3; and each p" independently represents 0 to 3.

In general formulas (C1-11) and (C1-12) above, in terms of efficiency in generation of a base, it is preferable that $R^{4a}$ and $R^{4b}$ has a nitro group as a substituent, and it is particularly desirable that the ortho position is substituted.

In terms of suppressing the diffusion length of the generated base, it is preferable that each of $R^{1a}$ and $R^{2a}$ is a cycloalkyl group of 5 to 10 carbon atoms.

m" is preferably 1. n" is preferably 0 to 2. p" is preferably 0 or 1.

Specific examples of the component (C1) are shown below.

[Chemical Formula 24]

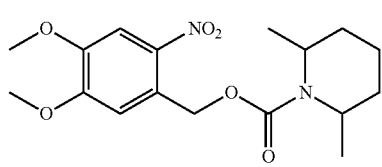
(C1-11-1)

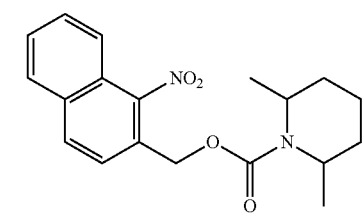
(C1-11-2)

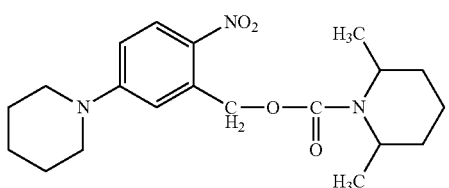
(C1-11-3)

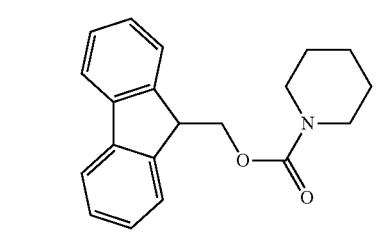
(C1-11-4)

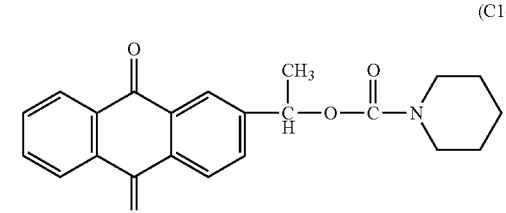
(C1-11-5)

[Chemical Formula 25]

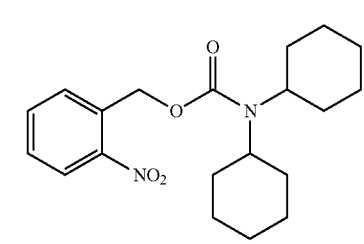
(C1-12-1)

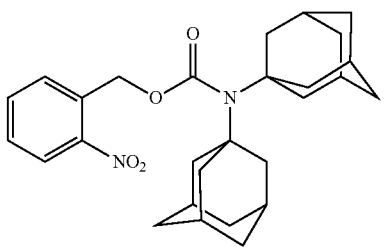
(C1-12-2)

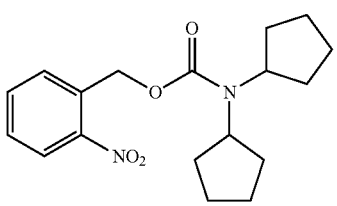
(C1-12-3)

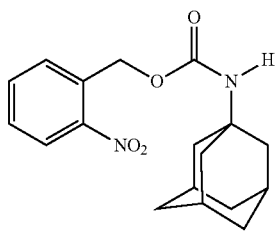
(C1-12-4)

Further, as a preferable example of the component (C), a compound represented by general formula (C2) shown below (hereafter, referred to as "component (C2)") can also be mentioned.

After absorbing the exposure energy by the exposure conducted in step (2), the component (C2) has the (—CH=CH—C(=O)—) portion isomerized to a cis isomer, and is further cyclized by heating, thereby generating a base ($NHR^1R^2$).

The component (C2) is preferable in that, not only a base can be generated, but also the effect of rendering the resist composition hardly soluble in an alkali developing solution after exposure can be obtained.

[Chemical Formula 26]

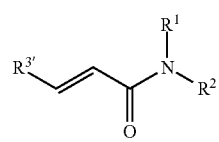
(C2)

In formula (C2), $R^1$ and $R^2$ are respectively the same as defined for $R^1$ and $R^2$ in the aforementioned formula (C1); and $R^{3'}$ represents an aromatic cyclic group having a hydroxy group on the ortho position.

In general formula (C2) above, it is preferable that $R^1$ and $R^2$ are mutually bonded together with the adjacent nitrogen atom to form a cyclic group represented by the aforementioned general formula (II). Further, $R^1$ and $R^2$ are preferably the same as defined for $R^{1a}$ and $R^{2a}$ in the aforementioned general formula (C1-12).

As the aromatic cyclic group for $R^{3'}$, the same groups having an aromatic ring as those described above for $R^3$ in the aforementioned general formula (C1) can be mentioned. As the ring skeleton, benzene, biphenyl, indene, naphthalene, fluorene, anthracene and phenanthrene are preferable, and a benzene ring is more preferable.

The aromatic cyclic group for $R^{3'}$ may have a substituent other than the hydroxy group on the ortho position. Examples of the substituent include a halogen atom, a hydroxy group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, and a monovalent organic group such as an alkyl group.

Specific examples of the component (C2) are shown below.

[Chemical Formula 27]

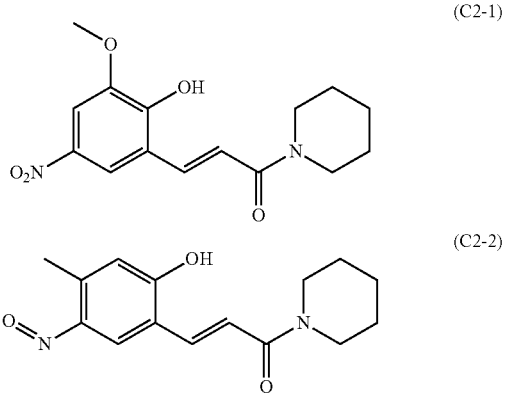

(C2-1)

(C2-2)

Further, as a preferable example of the component (C), a compound represented by general formula (C3) shown below (hereafter, referred to as "component (C3)") can also be mentioned.

After absorbing the exposure energy by the exposure, the component (C3) undergoes decarboxylation, and then reacts with water to generate amine (base).

[Chemical Formula 28]

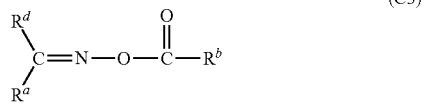

(C3)

In the formula, $R^a$ and $R^d$ each independently represents a hydrogen atom or a hydrocarbon group of 1 to 30 carbon atoms which may have a substituent (provided that, when both $R^a$ and $R^d$ represent a hydrocarbon group of 1 to 30 carbon atoms which may have a substituent, $R^a$ and $R^d$ are mutually bonded to form a ring); and $R^b$ represents an aryl group which may have a substituent or an aliphatic cyclic group which may have a substituent.

In general formula (C3) above, Ra represents a hydrogen atom or a hydrocarbon group of 1 to 30 carbon atoms which may have a substituent.

The hydrocarbon group of 1 to 30 carbon atoms for Ra which may have a substituent may be either an aromatic hydrocarbon group or an aliphatic hydrocarbon group.

The aromatic hydrocarbon group is a hydrocarbon group having an aromatic ring. The aromatic hydrocarbon group preferably has 5 to 30 carbon atoms, more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 to 3, and most preferably 1 or 2.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aforementioned aromatic hydrocarbon group include groups in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic hydrocarbon group for $R^a$ in general formula (C3) above may be either a saturated aliphatic hydrocarbon group, or an unsaturated aliphatic hydrocarbon group. Further, the aliphatic hydrocarbon group may be linear, branched or cyclic.

In the aliphatic hydrocarbon group for $R^a$ in general formula (C3) above, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $R^a$ in general formula (C3) above, there is no particular limitation as long as it is an atom other than carbon and hydrogen. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The cyclic aliphatic hydrocarbon group (aliphatic cyclic group) for $R^a$ in general formula (C3) above is an aliphatic cyclic group of 3 to 30 carbon atoms which may have a substituent.

In the aliphatic cyclic group for Ra in general formula (C3) above, part of the carbon atoms constituting the aliphatic cyclic group may be substituted with a substituent group containing a hetero atom, or part or all of the hydrogen atoms constituting the aliphatic cyclic group may be substituted with a substituent group containing a hetero atom.

As the "hetero atom" for Ra in general formula (C3) above, there is no particular limitation as long as it is an atom other than carbon and hydrogen, and examples thereof include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. These substituents may be contained in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic cyclic group may be either a monocyclic group or a polycyclic group. The aliphatic cyclic group has 3 to 30 carbon atoms, preferably 5 to 30, more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 29]

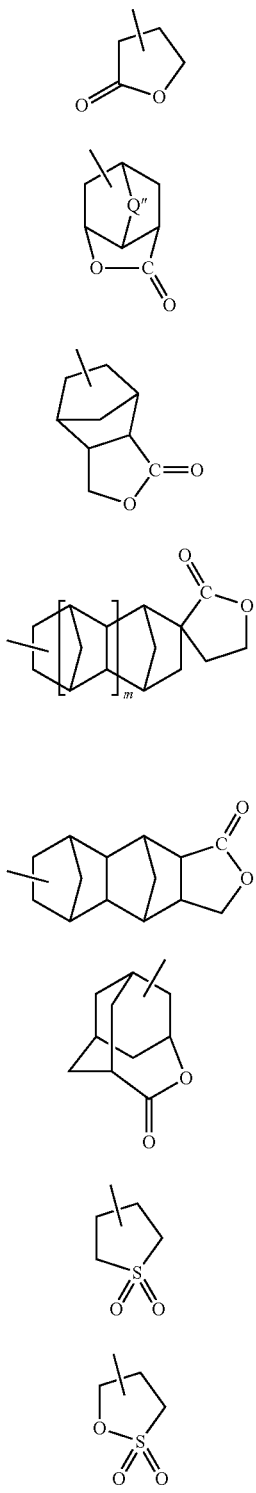

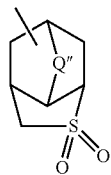

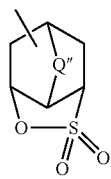

In the formula, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents 0 or 1.

In general formulas above, the alkylene group for Q" and R$^{94}$ to R$^{95}$ is preferably a linear or branched alkylene group, and has 1 to 5 carbon atoms, preferably 1 to 3.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$C$_2$CH$_2$CH$_2$CH$_2$C$_2$—].

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

Examples of the alkoxy group and the halogen atom include the same groups and atoms as those listed above for the substituent used for substituting part or all of the hydrogen atoms of the cyclic aliphatic hydrocarbon group (aliphatic cyclic group) for R$^a$.

As the aliphatic cyclic group for R$^a$ which may have a substituent in the aforementioned general formula (C3), an aliphatic polycyclic group which may have a substituent is preferable. As the aliphatic polycyclic group, the aforementioned group in which one or more hydrogen atoms have been removed from a polycycloalkane, and groups represented by formulas (L2) to (L6), (S3) and (S4) are preferable.

When $R^a$ in the aforementioned general formula (C3) represents a hydrocarbon group of 1 to 30 carbon atoms which may have a substituent, $R^a$ may form a ring with the adjacent carbon atom. The formed ring may be either monocyclic or polycyclic. The number of carbon atoms (including the carbon atom bonded thereto) is preferably 5 to 30, and more preferably 5 to 20.

Specifically, among the cyclic aliphatic hydrocarbon groups (aliphatic cyclic groups) for $R^a$ described above, aliphatic cyclic groups of 5 to 30 carbon atoms can be given as examples (provided that the carbon atom bonded thereto is regarded as part of the ring).

Examples of the aryl group for $R^b$ in the aforementioned general formula (C3) include the aromatic hydrocarbon groups described above for $R^a$, excluding arylalkyl groups. As the aryl group for $R^b$, a phenyl group is more preferable.

The aliphatic cyclic group for $R^b$ in the aforementioned general formula (C3) is the same as defined for the aliphatic cyclic group for $R^a$ in the aforementioned general formula (C3). The aliphatic cyclic group for $R^b$ is preferably an aliphatic polycyclic group, more preferably a group in which one or more hydrogen atoms have been removed from a polycycloalkane, and most preferably a group in which one or more hydrogen atoms have been removed from adamantane.

As the substituent which the aromatic hydrocarbon group or the aliphatic cyclic group for $R^b$ may have, the same substituents as those described above for $R^a$ in the aforementioned general formula (C3) can be mentioned.

$R^d$ in the aforementioned general formula (C3) is the same as defined for Ra in the aforementioned general formula (C3).

It is preferable that $R^d$ in the aforementioned general formula (C3) is a cyclic group which may have a substituent.

The cyclic group may be either an aromatic hydrocarbon group which may have a substituent, or an aliphatic cyclic group which may have a substituent, and an aromatic cyclic group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L6), (S3) and (S4) are preferable.

$R^d$ in the aforementioned general formula (C3) is more preferably a naphthyl group which may have a substituent, or a phenyl group which may have a substituent, and most preferably a phenyl group which may have a substituent.

When both $R^a$ and $R^d$ in the aforementioned general formula (C3) represent a hydrocarbon group of 1 to 30 carbon atoms which may have a substituent, Ra and $R^d$ are mutually bonded to form a ring. The formed ring may be either monocyclic or polycyclic. The number of carbon atoms (including the carbon atom bonded to $R^a$ and $R^d$ in the aforementioned general formula (C3) is preferably 5 to 30, and more preferably 5 to 20.

Specifically, among the cyclic aliphatic hydrocarbon groups (aliphatic cyclic groups) for $R^a$ described above, aliphatic cyclic groups of 5 to 30 carbon atoms can be given as examples, provided that the carbon atom bonded to Ra and $R^d$ in the aforementioned general formula (C3) is regarded as part of the ring.

Specific examples of the component (C3) are shown below.

[Chemical Formula 30]

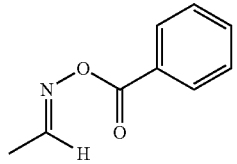 (C3-1)

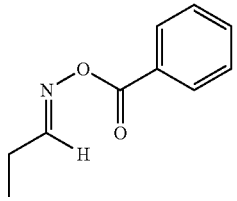 (C3-2)

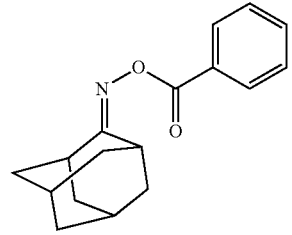 (C3-3)

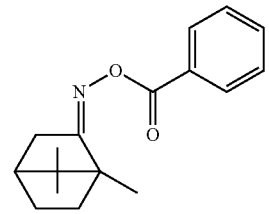 (C3-4)

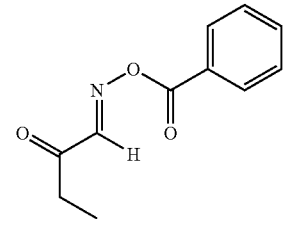 (C3-5)

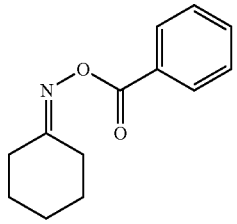 (C3-6)

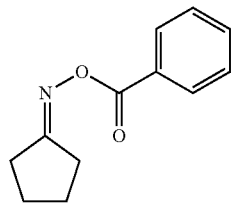 (C3-7)

(C3-8)
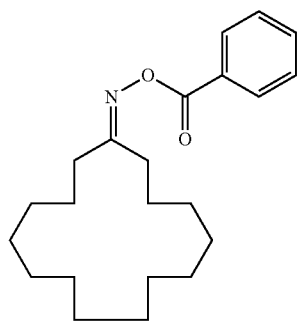
(C3-9)
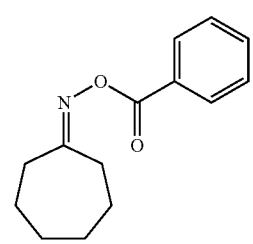
(C3-10)
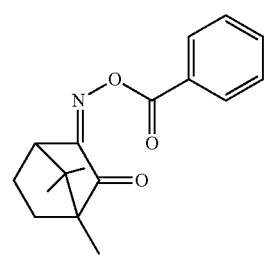
[Chemical Formula 31]
(C3-11)
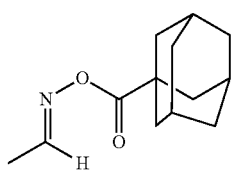
(C3-12)
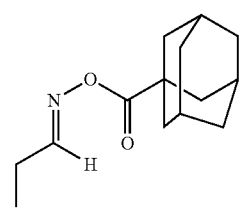
(C3-13)
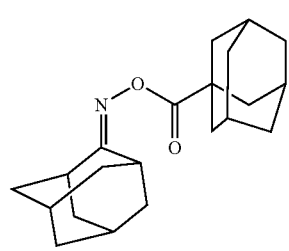
(C3-14)
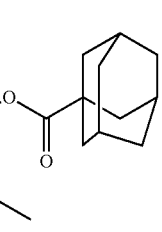
(C3-15)
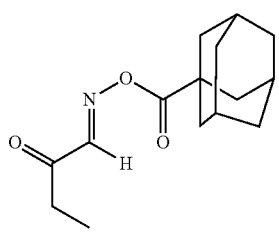
(C3-16)
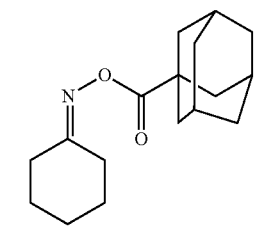
(C3-17)
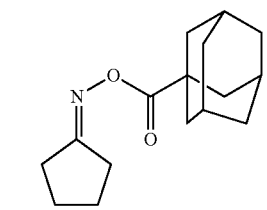
(C3-18)
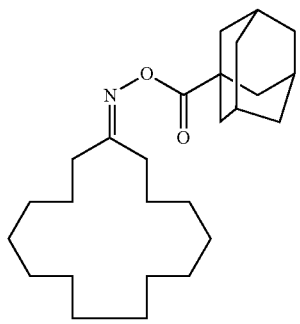
(C3-19)
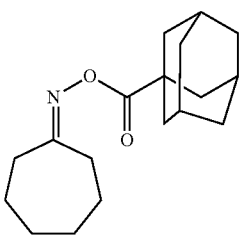

-continued (C3-20)

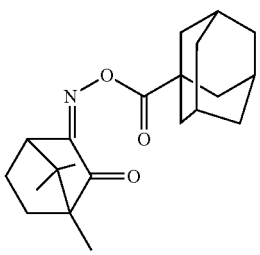

Further, as a preferable example of the component (C), the following acyloxyimino group-containing compounds (C4) can also be mentioned.

[Chemical Formula 32]

(C4-1)

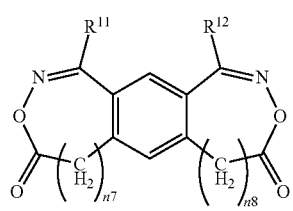

(C4-2)

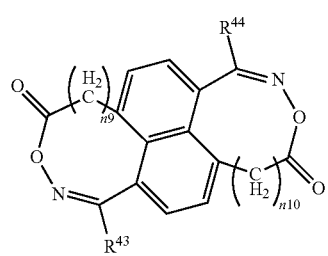

In the formulas, $R^{11}$, $R^{12}$, $R^{43}$ and $R^{44}$ each independently represents a hydrogen atom or an alkyl group of 1 to 5 carbon atoms; and n7 to n10 each independently represents 0 to 3.

Furthermore, as the component (C), other than the above examples, any of the known photo-base generators used in conventional chemically amplified resist compositions can be used.

Examples of such photo-base generators include ion-type photo-base generators (anion-cation complexes); triphenylsulfonium compounds; triphenylmethanol; photoactive carbamates, such as benzylcarbamate and benzoin carbamate; amides, such as o-carbamoylhydroxylamine, o-carbamoyloxime, aromatic sulfoneamide, alphalactum and N-(2-allylethynyl)amide; oximeesters; α-aminoacetophenone; cobalt complexes; and those exemplified in Japanese Unexamined Patent Application, First Publication No. 2007-279493.

As the component (C), one type of organic compound may be used alone, or two or more types of organic compounds may be used in combination.

Among these, as the component (C), the component (C1) is preferable, more preferably at least one compound selected from a compound represented by any one of general formulas (C1-11) and (C1-12). The compound represented by general formula (C1-12) is particularly desirable.

In the resist composition, the amount of the component (C), relative to 100 parts by weight of the component (A) is preferably from 0.05 to 50 parts by weight, more preferably from 1 to 30 parts by weight, and most preferably from 2 to 20 parts by weight.

When the amount of the component (C) is at least as large as the lower limit of the above-mentioned range, the film retentiveness of the resist film at exposed portions becomes excellent, and the effects of the present invention are improved. On the other hand, when the amount of the component (C) is no more than the upper limit of the above-mentioned range, the transparency of the resist film can be maintained.

<Acidic Compound Component (G1)>

The resist composition of the present invention includes an acidic compound component (G1) containing a nitrogen-containing cation having a pKa value of 7 or less and a counteranion (hereafter, referred to as "component (G1)").

In the present invention, the "acidic compound component" refers to a compound that exhibits acidity by itself, that is, a compound acting as a proton donor.

In the present invention, the component (G1) is an ionic compound (salt compound) containing a nitrogen-containing cation having a pKa value of 7 or less and a counteranion. The component (G1) contains the cation having a pKa value of 7 or less which has a relatively low pKa value, that is, a cation having low basicity. Therefore, even if forming a salt, the component (G1) exhibits acidity by itself, and acts as a proton donor.

Hereafter, each of the cation moiety and the anion moiety in the component (G1) will be described.

(Cation Moiety of Component (G1))

The cation moiety in the component (G1) is containing a nitrogen-containing cation having a pKa value of 7 or less.

In the present invention, pKa indicates an acid dissociation constant which is generally used as a parameter which shows the acid strength of an objective substance. The pKa value of the cation of the component (G1) can be determined by a conventional method. Alternatively, the pKa value can be estimated by calculation using a conventional software such as "ACD/Labs" (trade name; manufactured by Advanced Chemistry Development, Inc.).

The pKa of the component (G1) according to the present invention is not particularly limited as long as it is 7 or less, and the component (G1) can be appropriately selected depending on the type and pKa of the counteranion, so that is becomes a weak base relative to the counteranion, although the pKa of the cation of the component (G1) is preferably from −2 to 7.0, more preferably from −1 to 6.5, and still more preferably 0 to 6.0. When the pKa is no more than the upper limit of the above-mentioned range, the basicity of the cation can be rendered satisfactorily weak, and the component (G1) itself becomes an acidic compound. Further, when the pKa is at least as large as the lower limit of the above-mentioned range, a salt can be more reliably formed with the counteranion, and it becomes possible to appropriately control the acidity of the component (G1), thereby preventing deterioration of the post exposure stability of the latent image formed by the pattern-wise exposure of the resist layer, caused by the component (G1) being excessively acidic.

The structure of the cation moiety in the component (G1) is not particularly limited as long as it satisfies the above-mentioned pKa value and contains a nitrogen atom. Examples thereof include the cation represented by following general formula (G1c-1).

[Chemical Formula 33]

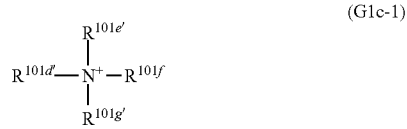

(G1c-1)

In the formula, $R^{101d'}$, $R^{101e'}$, $R^{101f'}$ and $R^{101g'}$ each independently represents a hydrogen atom, a linear, branched or cyclic alkyl group, an alkenyl group, an oxoalkyl group or an oxoalkenyl group of 1 to 12 carbon atoms, an aryl group of 6 to 20 carbon atoms, an aralkyl group of 7 to 12 carbon atoms or an aryloxoalkyl group, and part or all of the hydrogen atoms of these groups may be substituted with a fluorine atom or an alkoxy group. $R^{101d'}$ and $R^{101e'}$, or $R^{101d'}$, $R^{101e'}$ and $R^{101f'}$ may be mutually bonded with the nitrogen atom to form a ring, provided that, when a ring is formed, each of $R^{101d'}$ and $R^{101e'}$, or each of $R^{101d'}$, $R^{101e'}$ and $R^{101f'}$ independently represents an alkylene group of 3 to 10 carbon atoms, or forms a heteroaromatic ring containing the nitrogen atom in the ring thereof. When $R^{101d'}$, $R^{101e'}$, $R^{101f'}$ and $R^{101g'}$ are containing only an alkyl group and/or a hydrogen atom, at least one atom of the hydrogen atoms and the carbon atoms is substituted with a halogen atom such as a fluorine atom, an alkoxy group or a sulfur atom.

In general formula (G1c-1), $R^{101d'}$, $R^{101e'}$, $R^{101f'}$ and $R^{101g'}$ independently represents a hydrogen atom, a linear, branched or cyclic alkyl group, an alkenyl group, an oxoalkyl group or an oxoalkenyl group of 1 to 12 carbon atoms, an aryl group or an arylalkyl group of 6 to 20 carbon atoms, an aralkyl group of 7 to 12 carbon atoms or an aryloxoalkyl group.

The alkyl group for $R^{101d'}$ to $R^{101g'}$ includes the same alkyl groups as those described for the aforementioned $R^1$ and $R^2$, although the alkyl group for $R^{101d'}$ to $R^{101g'}$ preferably has 1 to 10 carbon atoms, and a methyl group, an ethyl group, a propyl group or a butyl group is particularly desirable.

The alkenyl group for $R^{101d'}$ to $R^{101g'}$ preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

The oxoalkyl group for $R^{101d'}$ to $R^{101g'}$ preferably has 2 to 10 carbon atoms, and examples thereof include a 2-oxoethyl group, a 2-oxopropyl group, a 2-oxocyclopentyl group and a 2-oxocyclohexyl group.

Examples of the oxoalkenyl group for $R^{101d'}$ to $R^{101g'}$ include an oxo-4-cyclohexenyl group and a 2-oxo-4-propenyl group.

As examples of the aryl group for $R^{101d'}$ to $R^{101g'}$, the same aryl groups as those described above in the aromatic hydrocarbon groups for $R^1$ and $R^2$ can be mentioned, and a phenyl group or a naphthyl group is preferable.

Examples of the aralkyl group and aryloxoalkyl group for $R^{101d'}$ to $R^{101g'}$ include a benzyl group, a phenylethyl group, a phenethyl group; a 2-phenyl-2-oxoethyl group, a 2-(1-naphthyl)-2-oxoethyl group and a 2-(2-naphthyl)-2-oxoethyl group.

When $R^{101d'}$ to $R^{101g'}$ are containing only an alkyl group and/or a hydrogen atom, at least one atom of the hydrogen atoms and the carbon atoms is substituted with a halogen atom such as a fluorine atom, an alkoxy group or a sulfur atom. It is preferable that a hydrogen atom in the alkyl group is substituted with a fluorine atom.

Further, $R^{101d}$ and $R^{101e}$, or $R^{101d}$, $R^{101e}$ and $R^{101f}$ may be mutually bonded to form a ring with the nitrogen atom.

Examples of the formed ring include a pyrrolidine ring, a piperidine ring, a hexamethylene imine ring, an azole ring, a pyridine ring, a pyrimidine ring, an azepine ring, a pyrazine ring, a quinoline ring and a benzoquinoline ring.

Further, the ring may contain an oxygen atom in the ring skeleton thereof, and examples of preferable rings which contain an oxygen atom include an oxazole ring and an isooxazole ring.

As the cation moiety represented by general formula (G1c-1) above, cation moieties represented by the following general formulas (G1c-11) to (G1c-13) are particularly desirable.

[Chemical Formula 34]

(G1c-11)

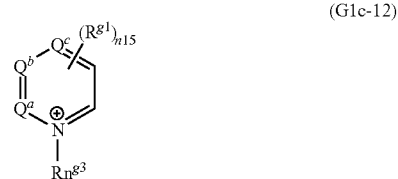

(G1c-12)

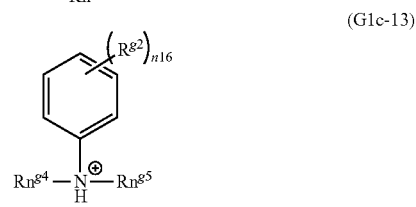

(G1c-13)

In the formulas, $Rf^{g1}$ represents a fluorinated alkyl group of 1 to 12 carbon atoms; $Rn^{g1}$ and $Rn^{g2}$ each independently represents a hydrogen atom or an alkyl group of 1 to 5 carbon atoms, provided that $Rn^{g1}$ and $R^{g2}$ may be mutually bonded to form a ring; $Q^a$ to $Q^c$ each independently represents a carbon atom or a nitrogen atom; $Rn^{g3}$ represents a hydrogen atom or a methyl group; $Rn^{g4}$ and $Rn^{g5}$ each independently represents an alkyl group of 1 to 5 carbon atoms or an aromatic hydrocarbon group; $R^{g1}$ and $R^{g2}$ each independently represents a hydrocarbon group; and n15 and n16 each independently represents an integer of 0 to 4, provided that, when n15 and n16 are 2 or more, the plurality of $R^{g1}$ and $R^{g2}$ which substitute the hydrogen atoms of the adjacent carbon atom may be bonded to form a ring.

In general formula (G1c-11) above, $Rf^{g1}$ represents a fluorinated alkyl group of 1 to 12 carbon atoms, and is preferably an alkyl group of 1 to 5 carbon atoms in which 50% or more of the hydrogen atoms of the alkyl group have been fluorinated.

In general formula (G1c-11) above, each of $Rn^{g1}$ and $Rn^{g2}$ independently represents a hydrogen atom or an alkyl group of 1 to 5 carbon atoms. As the alkyl group, the same alkyl groups of 1 to 5 carbon atoms as those described above in formula (G1c-1) can be mentioned. In addition, when both of $Rn^{g1}$ and $Rn^{g2}$ represent alkyl groups, alkyl groups for $Rn^{g1}$ and $Rn^{g2}$ may be mutually bonded to form a ring together with $NH^+$ in the formula.

In general formula (G1c-13) above, $Rn^{g4}$ and $Rn^{g5}$ each independently represents an alkyl group of 1 to 5 carbon atoms or an aromatic hydrocarbon group. As the alkyl group and the aromatic group, the same alkyl group of 1 to 5 carbon atoms as those described above for the alkyl group in the formula (G1c-1), and the same aryl group as those described above in the formula (G1c-1) each is preferable.

In general formulas (G1c-12) and (G1c-13) above, n15 and n16 each independently represents an integer of 0 to 4, preferably an integer of 0 to 2, and more preferably 0.

In general formulas (G1c-12) and (G1c-13) above, $R^{g1}$ and $R^{g2}$ each independently represents a hydrocarbon group, and is preferably an alkyl group or alkenyl group of 1 to 12 carbon atoms. The alkyl group and the alkenyl group are the same as defined for those described in the explanation of the aforementioned formula (G1c-1).

When n15 and n16 are 2 or more, the plurality of $R^{g1}$ and $R^{g2}$ may be the same or different from each other. Further, when n15 and n16 is 2 or more, the plurality of $R^{g1}$ and $R^{g2}$ which substitute the hydrogen atoms of the adjacent carbon atom may be bonded to form a ring. Examples of the formed ring include a benzene ring and a naphthalene ring. That is, the compound represented by formulas (G1c-12) and (G1c-13) may be a condensed ring compound formed by condensation of 2 or more rings.

Specific examples of compounds represented by the aforementioned general formulas (G1c-11) to (G1c-13) are shown below.

[Chemical Formula 35]

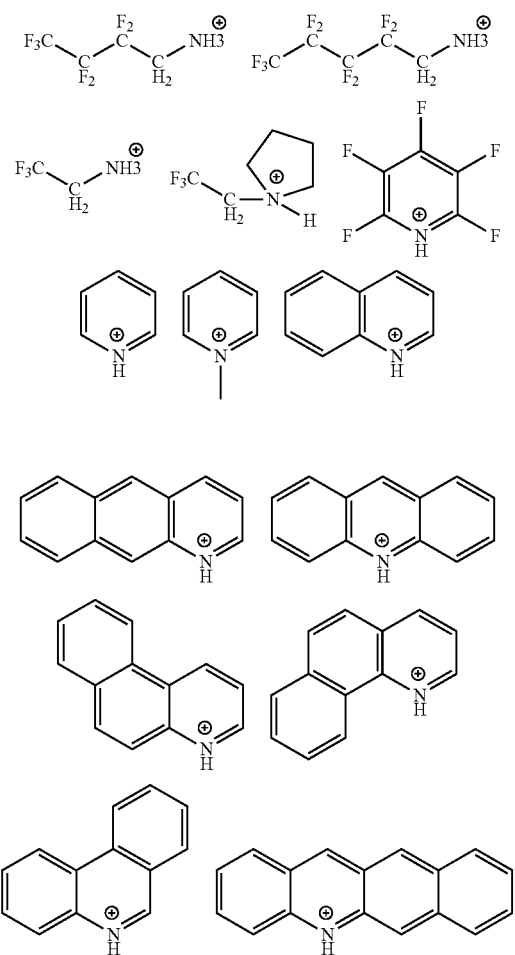

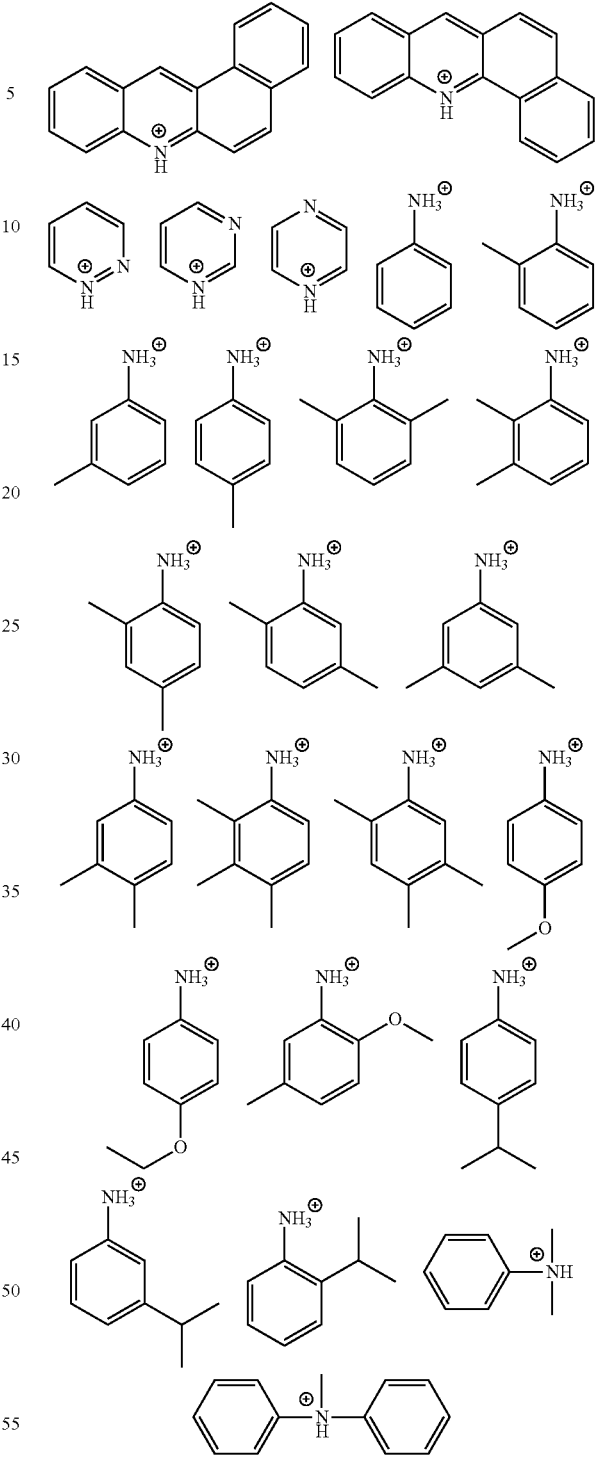

(Anion Moiety of Component (G1))

The anion moiety of the component (G1) is not particularly limited, and any of those generally used the anion moiety of a salt used in a resist composition may be appropriately selected for use.

Among these, as the anion moiety of the component (G1), those which forms a salt with the aforementioned cation moiety for the component (G1) to form a component (G1) that is capable of increasing the solubility of the component (A) in an alkali developing solution is preferable. The component (G1) "capable of increasing the solubility of the component (A) in an alkali developing solution" refers to a component (G1), for example, when a component (A) having a structural unit (a1) is used, by conducting baking, the component (G1) is capable of causing cleavage of at least part of the bond within the structure of the acid decomposable group in the structural unit (a1).

That is, the anion moiety of the component (G1) preferably has a strong acidity. Specifically, the pKa of the component (G1) is more preferably 0 or less, still more preferably −15 to −1, and most preferably −13 to −3. When the pKa of the anion moiety is no more than 0, the acidity of the anion can be rendered satisfactorily strong relative to a cation having a pKa of 7 or less, and the component (G1) itself becomes an acidic compound. On the other hand, when the pKa of the anion moiety is −15 or more, deterioration of the post exposure stability of the latent image formed by the pattern-wise exposure of the resist layer, caused by the component (G1) being excessively acidic can be prevented.

As the anion moiety of the component (G1), an anion moiety having at least one anion group selected from a sulfonate anion, a carboxylate anion, a sulfonylimide anion, a bis(alkylsulfonyl)imide anion and a tris(alkylsulfonyl)methide anion is preferable. More specific examples include anions represented by general formula: "$R^{4'''}SO_3^-$ ($R^{4'''}$ represents a linear, branched or cyclic alkyl group which may have a substituent, a halogenated alkyl group, an aryl group or an alkenyl group)".

In the aforementioned general formula "$R^{4'''}SO_3^-$", $R^{4'''}$ represents a linear, branched or cyclic alkyl group which may have a substituent, a halogenated alkyl group, an aryl group or an alkenyl group.

The linear or branched alkyl group for the aforementioned $R^{4'''}$ preferably has 1 to 10 carbon atoms, more preferably 1 to 8, and most preferably 1 to 4.

The cyclic alkyl group for the aforementioned $R^{4'''}$ preferably has 4 to 15 carbon atoms, more preferably 4 to 10 carbon atoms, and most preferably 6 to 10 carbon atoms.

The halogenated alkyl group for the aforementioned $R^{4'''}$ is an alkyl group in which part or all of the hydrogen atoms thereof have been substituted with a halogen atom. The alkyl group preferably has 1 to 5 carbon atoms, and is preferably a linear or branched alkyl group, and more preferably a methyl group, an ethyl group, a propyl group, an isopropyl group, an n-butyl group, a tert-butyl group, a tert-pentyl group or an isopentyl group. Examples of the halogen atom which substitutes the hydrogen atoms include a fluorine atom, a chlorine atom, an iodine atom and a bromine atom.

In the halogenated alkyl group, it is preferable that 50 to 100% of all hydrogen atoms within the alkyl group (prior to halogenation) have been substituted with a halogen atom, and it is preferable that all hydrogen atoms have been substituted with a halogen atom.

As the halogenated alkyl group, a fluorinated alkyl group is preferable. The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group is preferably from 10 to 100%, more preferably from 50 to 100%, and it is most preferable that all hydrogen atoms are substituted with fluorine atoms because the acid strength increases.

Specific examples of such fluorinated alkyl groups include a trifluoromethyl group, a heptafluoro-n-propyl group and a nonafluoro-n-butyl group.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X^3$-Q'- (in the formula, Q' represents a divalent linking group containing an oxygen atom; and $X^3$ represents a hydrocarbon group of 3 to 30 carbon atoms which may have a substituent).

Examples of halogen atoms and alkyl groups include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula $X^3$-Q'-, Q' represents a divalent linking group containing an oxygen atom.

Q' may contain an atom other than an oxygen atom. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl bond (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—$SO_2$—) bonded thereto.

Specific examples of such combinations include —$R^{91}$—O—, —$R^{92}$—O—C(=O)—, —C(=O)—O—$R^{93}$—O—C(=O)—, —$SO_2$—O—$R^{94}$—O—C(=O)—, and —$R^{95}$—$SO_2$—O—$R^{94}$—O—C(=O)— (in the formula, $R^{91}$ to $R^{95}$ independently represents an alkylene group).

The alkylene group for $R^{91}$ to $R^{95}$ is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

As Q', a divalent linking group containing an ester bond or an ether bond is preferable, and —$R^{91}$—O—, —$R^{92}$—O—C(=O)— or —C(=O)—O—$R^{93}$—O—C(=O)— is more preferable.

In the group represented by the formula $X^3$-Q'-, as the hydrocarbon group for $X^3$, the same hydrocarbon groups of 1 to 30 carbon atoms as those described for $R^a$ in the aforementioned general formula (C3).

Among these, as $X^3$, a linear alkyl group which may have a substituent, or a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the aforementioned formulas (L2) to (L6), (S3) and (S4) are preferable.

Among these examples, as the aforementioned $R^{4\prime\prime}$, a halogenated alkyl group or a group having $X^3$-$Q'$- as a substituent is preferable.

When the $R^{4\prime\prime}$ group has $X^3$-$Q'$- as a substituent, as $R^{4\prime\prime\prime}$, a group represented by the formula: $X^3$-$Q'$-$Y^3$— (in the formula, $Q'$ and $X^3$ are the same as defined above, and $Y^3$ represents an alkylene group of 1 to 4 carbon atoms which may have a substituent or a fluorinated alkylene group of 1 to 4 carbon atoms which may have a substituent is preferable.

In the group represented by the formula $X^3$-$Q'$-$Y^3$—, as the alkylene group for $Y^3$, the same alkylene group as those described above for $Q'$ in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^3$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —$CHF$—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)$ $CH_2CH_2$—, —$CH_2CH(CH_3)CH_2$—, —$CH(CH_3)CH$ $(CH_3)$—, —$C(CH_3)_2CH_2$—, —$CH(CH_2CH_3)CH_2$—, —$CH$ $(CH_2CH_2CH_3)$—, and —$C(CH_3)(CH_2CH_3)$—.

$Y^3$ is preferably a fluorinated alkylene group, and most preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)$ $CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2$ $CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

Specific examples of groups represented by formula $R^{4\prime\prime}$— $SO_3^-$ in which $R^{4\prime\prime}$ represents $X^3$-$Q'$-$Y^3$— include anions represented by the following formulas (an-1) to (an-3).

[Chemical Formula 36]

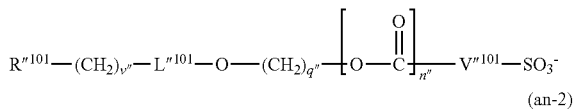
(an-1)

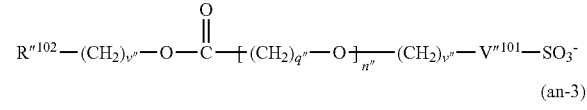
(an-2)

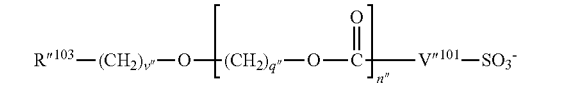
(an-3)

In the formulas, $R^{\prime\prime 101}$ represents an aliphatic cyclic group which may have a substituent, a group represented by each of formulas (r-hr-1) to (r-hr-6) described later or a chain-like alkyl group which may have a substituent; $R^{\prime\prime 102}$ represents an aliphatic cyclic group which may have a substituent, a lactone-containing cyclic group represented by each of the aforementioned formulas (a2-r-1) to (a2-r-7) or an —$SO_2$— containing cyclic group represented by each of the aforementioned formulas (a5-r-1) to (a5-r-4); $R^{\prime\prime 103}$ represents an aromatic cyclic group which may have a substituent, an aliphatic cyclic group which may have a substituent or a chain-like alkenyl group which may have a substituent; $V^{\prime\prime 101}$ represents a fluorinated alkylene group; $L^{\prime\prime 101}$ represents —$C(=O)$— or —$SO_2$—; $v''$ represents an integer of 0 to 3; $q''$ represents an integer of 1 to 20; and $n''$ represents 0 or 1.

As the aliphatic cyclic group for $R^{\prime\prime 101}$, $R^{\prime\prime 102}$ and $R^{\prime\prime 103}$ which may have a substituent, the same groups as those described below for the cyclic aliphatic hydrocarbon group in $Rk^{11}$ described later are preferable. As the substituent, the same groups as those described below for the substituents which may substitute the cyclic aliphatic hydrocarbon group in $Rk^{11}$ described later can be mentioned.

As the aromatic cyclic group for $R^{\prime\prime 103}$ which may have a substituent, the same groups as those described below for the aromatic hydrocarbon group in $Rk^{11}$ described later are preferable. As the substituent, the same groups as those described below for the substituents of the aromatic hydrocarbon group in $Rk^{11}$ described later can be mentioned.

As the chain-like alkyl group for $R^{\prime\prime 101}$ which may have a substituent, the same groups as those described below for the chain-like alkyl groups in $Rk^{11}$ described later are preferable. As the chain-like alkenyl group for $R^{\prime\prime 103}$ which may have a substituent, the same groups as those described below the chain-like alkenyl groups in $Rk^{11}$ described later are preferable. $V^{\prime\prime 101}$ is preferably a fluorinated alkylene group of 1 to 3 carbon atoms, and most preferably —$CF_2$—, —$CF_2CF_2$—, —$CHFCF_2$—, —$CF(CF_3)CF_2$— or —$CH(CF_3)CF_2$—.

Further, as preferable examples of the anion moiety of the component (G1), an anion represented by general formula (G1a-3) shown below and an anion moiety represented by general formula (G1a-4) shown below can also be mentioned.

[Chemical Formula 37]

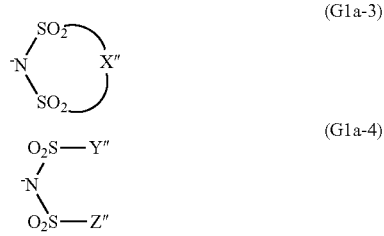

(G1a-3)

(G1a-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

In general formula (G1a-3) above, X" represents a linear or branched alkylene group in which at least one hydrogen atom has been substituted with a fluorine atom, and the alkylene group preferably has 2 to 6 carbon atoms, more preferably 3 to 5 carbon atoms, and most preferably 3 carbon atoms.

In formula (G1a-4), each of Y" and Z" independently represents a linear or branched alkyl group in which at least one hydrogen atom has been substituted with a fluorine atom, and the alkyl group preferably has 1 to 10 carbon atoms, more preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

As the anion moiety of the component (G1), an anion represented by the aforementioned formula "$R^{4"}SO_3^{-}$" (in particular, anions represented by the aforementioned formulas (an-1) to (an-3) which are a group in which $R^{4"}$ is "$X^3$-$Q'$-$Y^3$—") or an anion represented by the aforementioned formula (G1a-3) is most preferable.

As the component (G1), one type of compound may be used alone, or two or more types of compounds may be used in combination.

Further, the amount of the component (G1) within the resist composition, relative to 100 parts by weight of the component (A) is preferably from 0.5 to 30 parts by weight, more preferably from 1 to 20 parts by weight, and still more preferably from 2 to 15 parts by weight. It is thought that when the amount of the component (G1) is within the above-mentioned range, the resist composition exhibits excellent post exposure stability of the latent image formed by the pattern-wise exposure of the resist layer, and excellent lithography properties.

<Buffer Component (K)>

The resist composition of the present invention includes a buffer component (K) containing a nitrogen-containing cation and a counteranion being a conjugate base for the acid having a pKa value of 0 to 5 (hereafter, referred to as "component (K)").

It is thought that when the resist composition of the present invention includes the component (K), an acid component within the resist film is buffered to improve the post exposure stability of the latent image formed by the pattern-wise exposure of the resist layer after formation of the resist layer.

The nitrogen-containing cation which the component (K) may have is not particularly limited, and any of those generally used the cation moiety of a salt used in a resist composition may be appropriately selected for use.

The nitrogen-containing cation of the component (K) preferably has a pKa value of 7 or less, and examples thereof include the same as those described above for nitrogen-containing cation having a pKa value of 7 or less which the aforementioned component (G1) may have.

The anion moiety of the component (K) is a conjugate base for the acid having a pKa value of 0 to 5. The anion moiety of the component (K) is not particularly limited as long as it is a conjugate base for the acid having a pKa value of 0 to 5, and the anion moiety of the component (K) can be appropriately selected depending on the type and pKa of the cation, so that is becomes a weak acid relative to the cation. The anion moiety of the component (K) is preferably a conjugate base for the acid having a pKa value of 1 to 5, more preferably a conjugate base for the acid having a pKa value of 2 to 5, and still more preferably a conjugate base for the acid having a pKa value of 3 to 5. When the pKa is no more than the upper limit of the above-mentioned range, it is thought that the acidity of the anion can be rendered satisfactorily weak. On the other hand, when the pKa is at least as large as the lower limit of the above-mentioned range, a salt can be more reliably formed with the cation, and it becomes possible to appropriately control the buffering degree of the component (K).

The anion moiety of the component (K) is preferably a conjugate base for the acid of a carboxylic acid or a sulfonic acid which has a pKa value of 0 to 5. Preferable examples of the carboxylic acid are shown below. In the following formulas, it is thought that the compound labeled with an asterisk has at least pKa value of 4 or less (the compound labeled with the asterisk has similar pKa value to two compounds arranged thereabove).

[Chemical Formula 38]

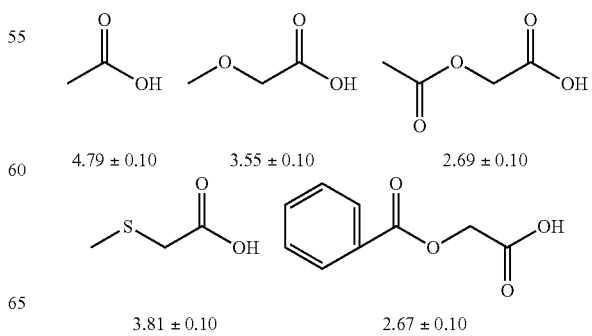

4.79 ± 0.10          3.55 ± 0.10          2.69 ± 0.10

3.81 ± 0.10                    2.67 ± 0.10

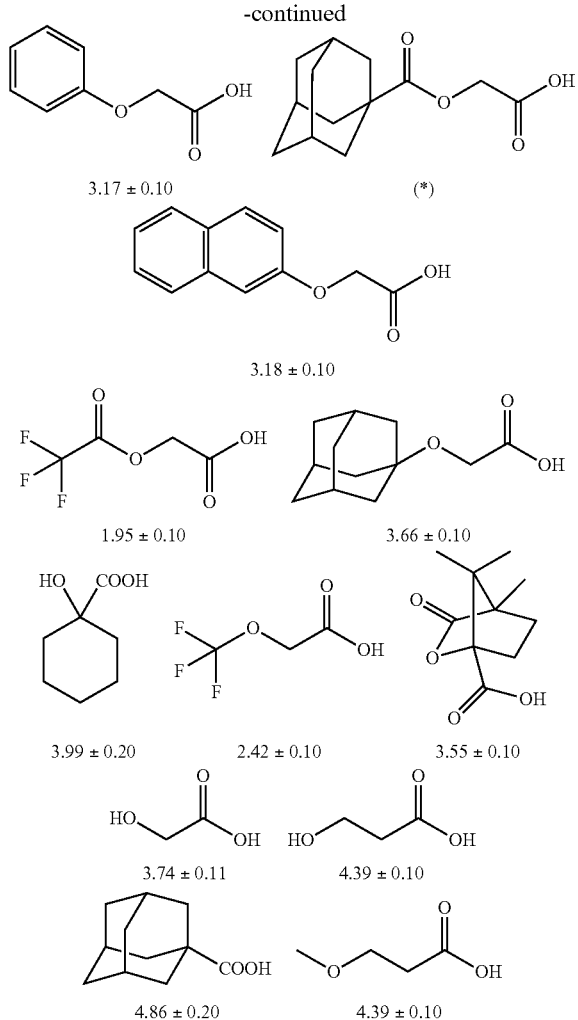

Examples of sulfonic acid which has a pKa value of 0 to 5 include an alkylsulfonic acid such as a methanesulfonic acid (pKa=1.75), a camphorsulfonic acid or the like. In addition, an arylsulfonic acid or the like such as a toluenesulfonic acid (pKa=−0.43) can be used, although it does not fall under the definition of the component (K).

In the present invention, the component (K) is preferably a salt compound having an anion moiety represented by general formula (K-1) shown below.

[Chemical Formula 39]

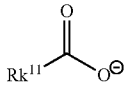

In the formula, $Rk^{11}$ represents a hydrocarbon group which may have a substituent.

In formula (K-1), $Rk^{11}$ represents a hydrocarbon group which may have a substituent. The hydrocarbon group for $Rk^{11}$ which may have a substituent may be either a cyclic or chain-like aliphatic hydrocarbon group or an aromatic hydrocarbon group.

Examples of the aromatic hydrocarbon group for $Rk^{11}$ include the same aromatic hydrocarbon ring as those described above for $R^a$ in the aforementioned general formula (C3), or an aryl group in which one hydrogen atom has been removed from an aromatic compound having two or more aromatic rings. The aromatic hydrocarbon group is preferably a phenyl group or a naphthyl group.

Examples of the cyclic aliphatic hydrocarbon group for $Rk^{11}$ include the same as those described above for a group in which one hydrogen atom has been removed from a monocycloalkane or a polycycloalkane of $R^a$ in the aforementioned general formula (C3). The cyclic aliphatic hydrocarbon group is preferably an adamantyl group or a norbornyl group.

Further, the cyclic aliphatic hydrocarbon group for $Rk^{11}$ may contain a hetero atom like heterocyclic ring et cetera. Specific examples thereof include the lactone-containing cyclic groups represented by the aforementioned general formulas (a2-r-1) to (a2-r-7), the —$SO_2$— containing cyclic groups represented by the aforementioned general formulas (a5-r-1) to (a5-r-4), and the following heterocyclic rings.

[Chemical Formula 40]

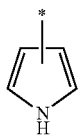
(r-hr-1)

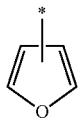
(r-hr-2)

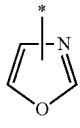
(r-hr-3)

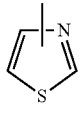
(r-hr-4)

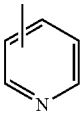
(r-hr-5)

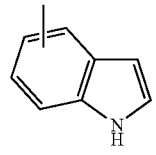
(r-hr-6)

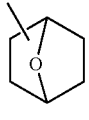
(r-rh-7)

-continued

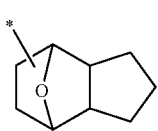 (r-rh-8)

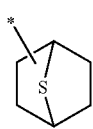 (r-rh-9)

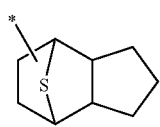 (r-rh-10)

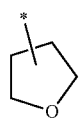 (r-rh-11)

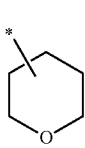 (r-rh-12)

 (r-rh-13)

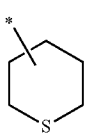 (r-rh-14)

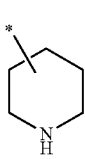 (r-rh-15)

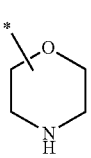 (r-rh-16)

As the substituent for the cyclic aliphatic hydrocarbon group of $Rk^{11}$, an alkyl group, an alkoxy group, a halogen atom, a halogenated alkyl group, a hydroxyl group, an oxygen atom (=O), a nitro group or the like can be used.

The alkyl group as the substituent therefor is preferably an alkyl group of 1 to 5 carbon atoms, and a methyl group, an ethyl group, a propyl group, an n-butyl group or a tert-butyl group is particularly desirable.

The alkoxy group as the substituent therefor is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent therefor include a fluorine atom, a chlorine atom, a bromine atom and an iodine atom, and a fluorine atom is preferable.

Example of the halogenated alkyl group as the substituent for the aforementioned aromatic hydrocarbon group of $Rk^{11}$ include groups in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

Examples of the chain-like aliphatic hydrocarbon group for $Rk^{11}$ include a chain-like alkyl group, a chain-like alkenyl group and the like.

The chain-like alkyl group for $Rk^{11}$ may be either linear or branched. The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The chain-like alkenyl group (monovalent unsaturated hydrocarbon group) for $Rk^{11}$ may be either linear or branched. The linear alkenyl group preferably has 2 to 10 carbon atoms, more preferably 2 to 5, still more preferably 2 to 4, and most preferably 3. Examples thereof include a vinyl group, a propenyl group (an allyl group) and a butenyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

Examples of substituents for the alkyl group or the alkenyl group of $Rk^{11}$ include an alkoxy group, a halogen atom, a halogenated alkyl group, a hydroxyl group, an oxygen atom (=O), a nitro group, an amino group and the aforementioned cyclic groups (cyclic aliphatic hydrocarbon groups) for $Rk^{11}$.

In the present invention, as the hydrocarbon group for $Rk^{11}$ which may have a substituent, an aromatic hydrocarbon group which may have a substituent or an aliphatic cyclic group which may have a substituent is preferable, and a phenyl group or a naphthyl group which may have a substituent, or a group in which one or more hydrogen atoms have been removed from a polycycloalkane such as adamantane, norbornane, isobornane, tricyclodecane or tetracyclododecane is more preferable.

Specific examples of preferred anion moiety of the component (K) are shown below.

[Chemical Formula 41]

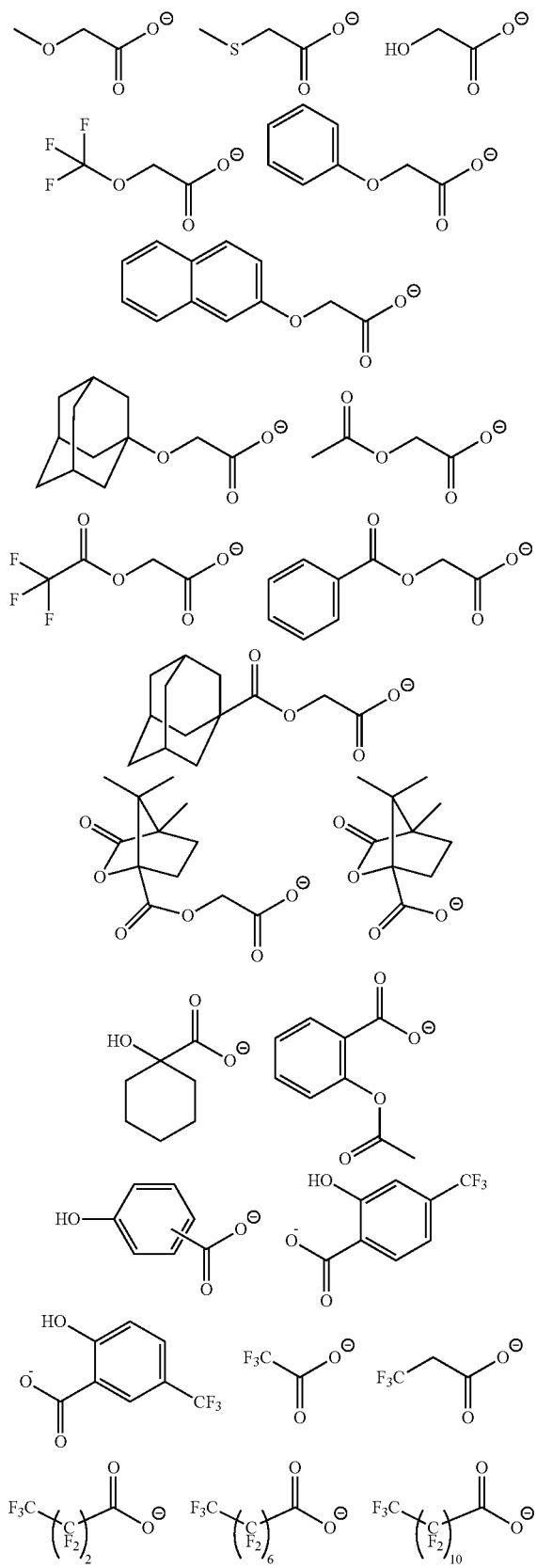

[Chemical Formula 42]

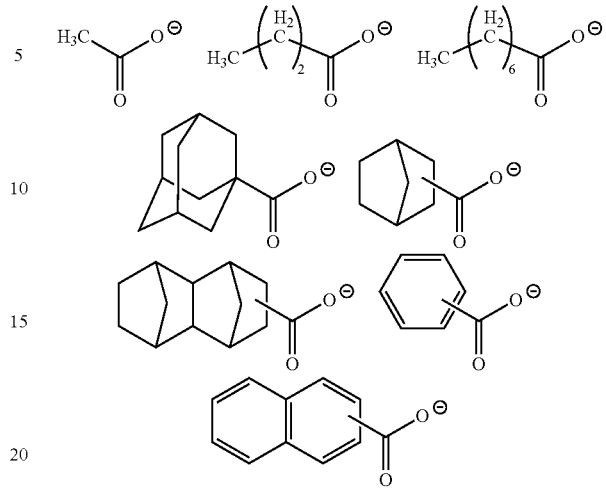

In the present invention, the anion of the component (K) may be an anion having appropriately weak acidity. In addition to the anion represented by the formula (K-1), the anion of the component (K) may be the aforementioned anions of sulfonic acids (anion having $SO_3^-$ in the structure thereof), or anions having $N^-$ (for example, alkylsulfonylamide anion).

<Basic Compound Component; Component (D)>

In the resist composition of the present invention, a basic compound component (D) (hereafter, referred to as "base component (D)") can further be blended.

In the resist composition liquid, the solubility of the component (A) in the alkali developing solution is likely to be increased by the action of the component (G1). The occurrence of this phenomenon can be suppressed by controlling the acidity of the component (G1) at an appropriate level, and also can be suppressed by adding the component (D) to reduce the acidity of the component (G1) in the resist composition liquid. When the component (D) is used, it is preferable that raw materials such as the component (G1) can be freely selected.

In addition, during storage of the resist composition, by virtue of the component (D), the storage stability after preparation of the resist composition liquid can be enhanced. Furthermore, by removing the component (D) from the resist film before neutralization in the step (3), lithography properties and pattern shape become particularly excellent, because the neutralization of base generated from the component (A) with the acid derived from the component (G1) in the step (3) is not suppressed by the component (D).

A multitude of these components (D) have already been proposed, and any of these known compounds may be used. It is particularly desirable that the pKa of the component (D) is equal to or less than the pKa of the cation moiety of the aforementioned component (G1). That is, the pKa of the component (D) is preferably 7 or less, and more preferably 6 or less. Here, it is more preferable that the pKa of the component (D) is less than or equal to the pKa of the cation moiety of the component (G1) so as to prevent a cation of the component (G1) from being exchanged with the component (D).

As the component (D) which satisfies the above pKa, an amine in which one of "$H^+$" bonded to an nitrogen atom (N) has been removed from an amine represented by the formula (G1c-1) described in relation to the component (G1) can be mentioned. Specifically, a compound in which "$NH_3^+$" at the terminal of the specific examples of the compounds represented by the formulas (G1c-11) and (G1c-13) has been replaced by "NH$_2$"; and a compound in which "NH$^+$" within the ring in the specific examples of the compounds represented by the formula (G1c-12) has been replaced by "N" are preferable.

In addition, it is desirable that the component (D) is an amine having a relatively low boiling point. By virtue of the amines having a relatively low boiling point, when a resist film is formed on the substrate in the step (1), the component (D) is readily removed from the resist film.

As the component (D) which satisfies the above boiling point, an amine having a boiling point of 130° C. or lower is preferable, and an amine having a boiling point of 100° C. or lower is more preferable, and an amine having a boiling point of 90° C. or lower is particularly preferable.

Specific examples of the component (D) which satisfies the above pKa and boiling point, aliphatic amine compounds having a fluorinated alkyl group such as trifluoroethylamine (2,2,2-trifluoroethylamine), pentafluoropropylamine (2,2,3,3,3-pentafluoropropylamine), heptafluorobutylamine (1H,1H-heptatluorobutylamine), nonafluoropentylamine (1H,1H-nonafluoropentylamine), undecafluorohexylamine (1H,1H-undecafluorohexylamine), bis (2,2,2-trifluoroethyl)amine, bis(2,2,3,3,3-pentafluoropropyl)amine, and 1-(2,2,2-trifluoroethyl)pyrrolidine; pyridine-based compound such as pyridine and pentafluoropyridine; and oxazole-based compound such as oxazole and isoxazole.

As the component (D), one type of compound may be used alone, or two or more types of compounds may be used in combination.

When the resist composition of the present invention contains the component (D), the amount of the component (D) relative to 100 parts by weight of the component (A) is preferably within a range from 0.01 to 20 parts by weight, more preferably from 1 to 15 parts by weight, and particularly preferably from 2 to 10 parts by weight. By ensuring the above-mentioned range, the storage stability is improved, and lithography properties and resist pattern shape are also improved.

[Component (S)]

The resist composition of the present invention can be produced by dissolving the materials for the resist composition in an organic solvent (hereafter also referred to as "component (S)").

The component (S) may be any organic solvent which can dissolve the respective components to give a uniform solution, and one or more types of organic solvent may be selected appropriately from those solvents that have been conventionally known as solvents for a chemically amplified resists.

Examples thereof include:

lactones such as γ-butyrolactone;

ketones such as acetone, methyl ethyl ketone, cyclohexanone, methyl-n-pentyl ketone, methyl isopentyl ketone, and 2-heptanone;

polyhydric alcohols, such as ethylene glycol, diethylene glycol, propylene glycol and dipropylene glycol;

compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

The amount of the component (S) is not particularly limited, but is appropriately adjusted to a concentration which enables coating of a coating solution to a substrate, depending on the thickness of the coating film. In general, the organic solvent is used in an amount such that the solid content of the resist composition becomes within the range from 1 to 20% by weight, preferably from 1.5 to 15% by weight, and more preferably from 1.8 to 5% by weight.

If desired, other miscible additives can also be added to the resist composition of the present invention. Examples of such miscible additives include additive resins (for example, fluorine-containing resin) for improving the performance of the resist film, surfactants for improving the applicability, dissolution inhibitors, plasticizers, stabilizers, colorants, halation prevention agents, and dyes.

<<Method of Forming Resist Pattern>>

The method of forming a resist pattern according to the present invention includes forming a resist film on a substrate using a resist composition of the present invention; conducting exposure of the resist film; and developing the resist film to form a resist pattern.

Examples of the method of forming a resist pattern include a method of forming a negative resist pattern including: a step (1) in which a resist film is formed on the substrate using a resist composition including the base component (A), the component (C), the component (G1) and the component (K); a step (2) in which the resist film is subjected to exposure; a step (3) in which a bake is conducted after the step (2), such that, at an unexposed portion of the resist film, the solubility of a base component (A) in an alkali developing solution is increased by the action of the component (G1); and a step (4) in which the resist film is subjected to an alkali development.

According to the present embodiment, by neutralizing the base generated from the component (C) or the base component (A) and the component (G1) at an exposed portion of the resist film, the exposed portion of the resist film can not be dissolved and removed by the alkali development; on the other hand, the unexposed portion of the resist film can be dissolved and removed by the alkali development.

Hereinbelow, the method of forming a resist pattern according to the present invention will be described, with reference to the drawings. However, the present invention is not limited to these embodiments.

Firstly, as shown in FIG. 1A, the resist composition is applied to a substrate 1 to form a resist film 2 (step (1); FIG. 1A).

Figure 1B:
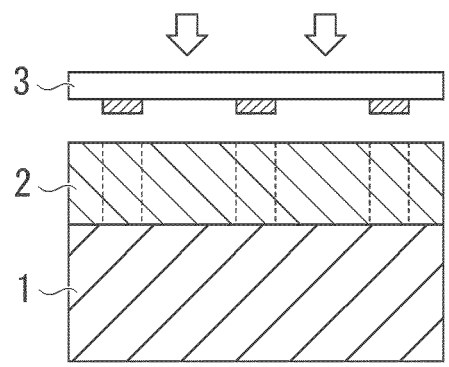

Next, as shown in FIG. 1B, the resist film 2 formed in the step (1) is subjected to exposure through a photomask 3 having a predetermined pattern formed thereon. As a result, in the exposed region (exposed portions) of the resist film 2, a base is generated from the component (C) or the component (A) upon exposure (step (2); FIG. 1B).

Figure 1C:
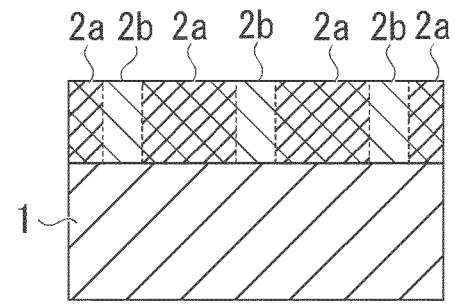

After exposure, baking (post exposure bake (PEB)) is conducted. By this baking, at the unexposed portions 2*b* of the resist film 2, the solubility of the component (A) in an alkali developing solution can be increased by the action of the acid (component (G1)) provided to the resist film 2 by adding the component (G1) to the resist composition. On the other hand, at exposed portions 2*a*, a neutralization reaction between the base generated from the component (C) or the component (A) upon exposure and the acid provided to the resist film 2 proceeds, so that the solubility of the component (A) in an alkali developing is either unchanged or only slightly changed. As a result, a difference in the dissolution rate in an alkali developing solution (dissolution contrast) occurs between the exposed portions 2*a* and the unexposed portions 2*b* (step (3); FIG. 1C).

Figure 1D:
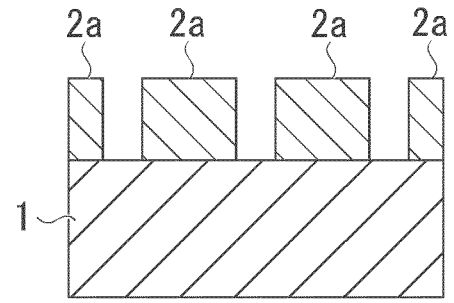

Thereafter, developing is conducted using an alkali developing solution. By conducting development, the exposed portions 2*a* of the resist film 2 remain, and the unexposed portions 2*b* of the resist film 2 are dissolved and removed. As a result, as shown in FIG. 1D, a resist pattern including a plurality of resist patterns arranged at intervals is formed on the substrate 1 (step (4); FIG. 1D).

[Step (1)]

The resist composition of the present invention is applied to the substrate 1 to form the resist film 2.

The substrate 1 is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate 1, any one of the above-mentioned substrates provided with an inorganic and/or organic film on the surface thereof may be used. The substrates provided with the organic film on the surface thereof are preferable. As the inorganic film, an inorganic antireflection film (inorganic BARC) can be used. As the organic film, an organic antireflection film (organic BARC) and an organic film such as a lower-layer organic film used in a multilayer resist method can be used. When the organic film is particularly provided, a pattern can readily be formed on the substrate with a high aspect ratio. Accordingly, the organic film is useful in the production of semiconductors.

Here, a "multilayer resist method" is method in which at least one layer of an organic film (lower-layer film) and at least one layer of a resist film are provided on a substrate, and a resist pattern formed on the upper resist film is used as a mask to conduct patterning of the lower-layer film. This method is considered as being capable of forming a pattern with a high aspect ratio. The multilayer resist method is broadly classified into a method in which a double-layer structure consisting of an upper-layer resist film and a lower-layer film is formed, and a method in which a multilayer structure having at least three layers containing an upper-layer resist film, a lower-layer film and at least one intermediate layer (thin metal film or the like) provided between the upper-layer resist film and the lower-layer film. In the multilayer resist method, a desired thickness can be ensured by the lower-layer film, and as a result, the thickness of the resist film can be reduced, and an extremely fine pattern with a high aspect ratio can be formed.

An inorganic film can be formed, for example, by coating an inorganic anti-reflection film composition such as a silicon-based material on a substrate, followed by baking.

An organic film can be formed, for example, by dissolving a resin component and the like for forming the film in an organic solvent to obtain an organic film-forming material, coating the organic film-forming material on a substrate using a spinner or the like, and baking under heating conditions preferably in the range of 200 to 300° C. for 30 to 300 seconds, more preferably for 60 to 180 seconds. The organic film-forming material does not need to have susceptibility to light or electron beam like a resist film, and the organic film-forming material may or may not have such susceptibility. More specifically, a resist or a resin generally used in the production of a semiconductor device or a liquid crystal display device can be used.

Further, it is preferable that the organic film-forming material can be subjected to etching, particularly dry etching, so that, by etching the organic film using a resist pattern, the resist pattern can be transferred to the organic film, and an organic film pattern can be formed. It is particularly desirable to use an organic film-forming material which can be subjected to oxygen plasma etching or the like. As such an organic film-forming material, a material conventionally used for forming an organic film such as an organic BARC can be used. Examples of such an organic film-forming material include the ARC series manufactured by Brewer Science Ltd., the AR series manufactured by Rohm and Haas Company, and the SWK series manufactured by Tokyo Ohka Kogyo Co., Ltd.

In the present invention, the component (G1) included in the resist composition is neutralized with a base generated from the component (A) upon exposure at exposed portions 2*a* in the steps (2) and (3) described later. As a result, the solubility of the component (A) in an alkali developing is either unchanged or only slightly changed. In the step (3) described later, the component (G1) act as an acid to the component (A) by baking (PEB), thereby increasing the solubility of the component (A) at unexposed portions 2*b* in an alkali developing solution.

For details, the resist composition is the same as the resist composition of the present invention described above.

The method of applying the resist composition of the present invention to the substrate 1 to form a resist film 2 is not particularly limited, and the resist film 2 can be formed by a conventional method.

For example, the resist composition can be applied to the substrate 1 by a conventional method such as spincoat method using a spin coater or barcoat method using a barcoater, followed by drying on a cooling plate at room temperature or conducting prebake (PAB), thereby forming a resist film 2.

In the present invention, the term "prebake" refers to a heating treatment of 70° C. or more by a hotplate and the like which is conducted between coating a resist composition on a substrate and exposing it.

When a prebake treatment is conducted, the temperature condition is preferably from 80 to 150° C., and more preferably 80 to 100° C.; and the bake treatment time is preferably from 40 to 120 seconds, more preferably from 60 to 90 seconds. When conducting prebake, even if the thickness of the resist film is thick, the organic solvent is easily vaporized.

By drying the resist composition at a room temperature and not conducting prebake, it is possible to reduce the number of steps for forming a resist pattern and to enhance the resolution of obtained resist pattern.

The presence or absence of the prebake can be appropriately determined in view of the aforementioned advantages, depending on the raw materials of the resist composition to be used, or depending on the target of the pattern to be formed.

The thickness of the resist film 2 formed in the step (1) is preferably 50 to 500 nm, and more preferably 50 to 450 nm. By ensuring that the thickness of the resist film satisfies the above-mentioned range, a resist pattern with a high level of resolution can be formed, and a satisfactory level of etching resistance can be achieved.

In addition, when not conducting prebake, the thickness of the resist film 2 formed in the step (1) is preferably 300 nm or less, more preferably 200 nm or less, and particularly preferably 50 to 150 nm. When the thickness of the resist film 2 is no more than the upper limit of the above-mentioned range, even if prebake is not conducted, an organic solvent is less likely to be remained and likely to be vaporized by an application such as spin-coating at a room temperature, and hence, uniformity of thickness (in-plane uniformity on the substrate 1) of the resist film 2 is enhanced. The effect obtained by not conducting prebake can be prominently obtained especially in the case of thin resist film.

[Step (2)]

The resist film 2 formed in the step (1) is selectively exposed through a photomask 3. As a result, at exposed portions 2a, a base is generated from the component (C) or the component (A) upon exposure. Therefore, a neutralization reaction starts between the base and the acid (component (G1)) within the resist film 2.

When the component (A) has the structural unit (a15), a base generated from the structural unit (a15) upon exposure is readily diffused within the entire exposed portions 2a of the resist film 2. Accordingly, the base is neutralized with more acids present in the exposed portions 2a.

With respect to the exposure dose, an amount capable of generating a base from he component (C) or the component (A) in an amount necessary to neutralize the acid present in the exposed portions 2a is sufficient.

The wavelength to be used for exposure is not particularly limited and the exposure can be conducted using radiation such as KrF excimer laser, ArF excimer laser, $F_2$ excimer laser, extreme ultraviolet rays (EUV), vacuum ultraviolet rays (VUV), electron beam (EB), X-rays, and soft X-rays. In terms of forming a fine resist pattern, ArF excimer laser, EUV or EB is preferable, and ArF excimer laser is particularly desirable.

The photomask 3 is not particularly limited, and a conventional mask can be used. For example, a binary mask in which the transmittance of the light shielding portion is 0% or a halftone-phase shift mask (HT-mask) in which the transmittance of the light shielding portion is 6% can be used. The unexposed portions can be selectively formed by using a halftone-phase shift mask.

As a binary mask, those in which a chromium film, a chromium oxide film, or the like is formed as a light shielding portion on a quartz glass substrate are generally used.

A phase shift mask is a photomask provided with a portion (shifter) which changes the phase of light. Thus, by using a phase shift mask, incidence of light to unexposed portions can be suppressed, and the dissolution contrast to an alkali developing solution can be improved between unexposed portions and exposed portions. As a phase shift mask other than a halftone-phase shift mask, a Levenson-phase shift mask can be mentioned. As any of these phase shift masks, commercially available masks can be used.

Specific examples of the half-tone type phase shift masks include those in which an MoSi (molybdenum silicide) film, a chromium film, a chromium oxide film, an silicon oxynitride film, or the like is formed as a light shielding portion (shifter) exhibiting a transmittance of about several 10% (generally 6%) on a substrate generally made of quartz glass.

In the present embodiment, exposure is conducted through a photomask 3, but the present invention is not limited to this embodiment. For example, the exposure may be conducted without using a mask, e.g., selective exposure by drawing with electron beam (EB) or the like.

The exposure of the resist film 2 can be either a general exposure (dry exposure) conducted in air or an inert gas such as nitrogen, or immersion exposure (immersion lithography) through an immersion medium. In step (2), in terms of forming a resist pattern with a high resolution, it is preferable to conduct exposure through an immersion medium.

In immersion lithography, exposure (immersion exposure) is conducted in a state where the region between the lens and the resist film 2 formed on the substrate 1 (which was conventionally filled with air or an inert gas such as nitrogen) is filled with a solvent (a immersion medium) that has a larger refractive index than the refractive index of air.

More specifically, in immersion lithography, the region between the resist film 2 formed in the above-described manner and lens at the lowermost portion of the exposure apparatus is filled with a solvent (an immersion medium) that has a larger refractive index than the refractive index of air, and in this state, the resist film 2 is subjected to exposure (immersion exposure) through a predetermined photomask 3.

The immersion medium preferably exhibits a refractive index larger than the refractive index of air but smaller than the refractive index of the resist film 2 to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film 2 include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the immersion medium after the exposure can be removed by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

[Step (3)]

In the present invention, after the step (2), baking (post exposure bake (PEB)) is conducted.

In the baking, the temperature conditions is preferably from 50 to 200° C., more preferably from 80 to 150° C., and still more preferably from 90 to 130° C. The baking time is preferably from 10 to 300 seconds, more preferably from 40 to 120 seconds, and still more preferably from 60 to 90 seconds.

In this manner, by conducting baking of the resist film 2 after exposure, in the entire resist film 2, the component (G1) blended in the resist composition acts as an acid. The solubility of the base component (A) in an alkali developing solution can be increased by the action of the acid (component (G1)) at the unexposed portions 2b of the resist film 2. On the other hand, at exposed portions 2a of the resist film 2, a neutralization reaction between the base generated from the component (C) or the component (A) upon exposure and the acid (component (G1)) proceeds, so that the amount of acid which would act on the base component (A) decreases. As a result, the solubility of the base component (A) in an alkali developing is either unchanged or only slightly changed. As such, a difference in the dissolution rate in an alkali developing solution (dissolution contrast) occurs between the exposed portions 2a and the unexposed portions 2b. Therefore, the film retentiveness at exposed portions 2a is enhanced, and the resist pattern to be formed exhibits excellent uniformity in size thereof. The baking in this step (3) does not necessarily control the start of the neutralization reaction.

[Step (4)]

In the present embodiment, after the step (3), by conducting alkali developing, the unexposed portions 2b of the resist film 2 are dissolved and removed, and the exposed portions 2a are retained, thereby forming a negative resist pattern.

Specific examples of the alkali developing solution include inorganic alkalis, such as sodium hydroxide, potassium hydroxide, sodium carbonate, sodium silicate, sodium metasilicate and aqueous ammonia; primary amines, such as ethylamine and n-propyl amine; secondary amines, such as diethylamine and di-n-butylamine; tertiary amines, such as triethylamine and methyldiethylamine; alcoholamines, such as dimethylethanolamine and triethanolamine; quaternary ammonium salts, such as tetramethylammonium hydroxide and tetraethylammonium hydroxide; and cyclic amines, such as pyrrole and piperidine.

Among these examples, as the alkali developing solution, an aqueous alkali solution containing at least one member selected from the group consisting of primary amines, secondary amines, tertiary amines and quaternary ammonium salts is preferable, and an aqueous solution of tetramethylammonium hydroxide (TMAH) is particularly desirable.

Further, the aforementioned aqueous alkali solution having alcohols, surfactants added thereto in an appropriate amount may be used.

In general, the alkali concentration within the alkali developing solution (i.e., concentration of inorganic alkalis, quaternary ammonium salts or amine compounds, based on the total weight of the alkali developing solution) is from 0.01 to 20% by weight.

The alkali developing treatment can be performed by a conventional method.

After the alkali development, a rinse treatment using pure water or the like may be conducted.

In addition, after the alkali development, a further baking (post bake) may be conducted. Post bake (which is performed in order to remove water content after the alkali developing and rinsing) is generally conducted at about 100° C. preferably for 30 to 90 seconds.

When an acidic compound component containing a nitrogen-containing cation having a pKa value of 7 or less and a counteranion is used, it is possible to suppress the action of an acid from the component (G1) to the component (A) before baking in the step (3). In the present invention, when the buffer component (K) containing a nitrogen-containing cation and a counteranion being a conjugate base for the acid having a pKa value of 0 to 5 is used, acidity within the resist film can be kept low in the step (1) and (2). As a result, it can be achieved to enhance the contrast in deprotection reaction of the component (A) before and after baking in the step (3). Therefore, it is thought to improve various lithography properties.

Further, in the case where the resist composition includes the component (D) in addition to the component (G1), since the component (D) is easily vaporized after coating in the step (1); in contrast, the component (K) forming a salt is less likely to be vaporized as compared to the component (D), it is thought that acidity within the resist film can be kept low.

In the resist composition of the present invention, it is thought that at exposed portions, the photo-base generator component (C) exhibits quenching ability; at unexposed portions, the solubility of the base component (A) in an alkali developing solution can be increased by the action of acid.

It is presumed that when the resist composition of the present invention includes the component (K), an acid component (component (G1)) within the resist film is buffered by the component (K); therefore, deprotection of the base component can be suppressed; accordingly, there is provided the resist composition and the method of forming a resist pattern, which forms the resist film that exhibits excellent post exposure stability of the latent image formed by the pattern-wise exposure of the resist layer.

EXAMPLES

As follows is a description of examples of the present invention, although the scope of the present invention is by no way limited by the following examples.

Examples 1 to 3, Comparative Examples 1 to 3

The components shown in Table 1 were mixed together and dissolved to prepare resist compositions.

TABLE 1

|  | Component (A) | Component (G1) | Component (C) | Component (K) | Component (D) | Component (S) | Initial receding angle (°) | Still-standing receding angle (°) | ΔrCA (°) |
|---|---|---|---|---|---|---|---|---|---|
| Example 1 | (A)-1 [100] | (G1)-1 [10] | (C)-1 [10] | (K)-1 [6] | — | (S)-1 [3000] | 6.35 | 63.4 | 0.1 |
| Example 2 | (A)-1 [100] | (G1)-1 [10] | (C)-1 [10] | (K)-1 [6] | (D)-1 [4] | (S)-1 [3000] | 54.2 | 64.2 | 0 |
| Example 3 | (A)-2 [100] | (G1)-1 [10] | (C)-1 [10] | (K)-1 [6] | (D)-1 [4] | (S)-1 [3000] | 62.6 | 62.7 | 0.1 |

TABLE 1-continued

| | Component (A) | Component (G1) | Component (C) | Component (K) | Component (D) | Component (S) | Initial receding angle (°) | Still-standing receding angle (°) | ΔrCA (°) |
|---|---|---|---|---|---|---|---|---|---|
| Comparative Example 1 | (A)-1 [100] | (G1)-1 [10] | (C)-1 [10] | — | — | (S)-1 [3000] | 64.3 | 28.6 | −35.7 |
| Comparative Example 2 | (A)-1 [100] | (G1)-1 [10] | (C)-1 [10] | — | (D)-1 [4] | (S)-1 [3000] | 64.3 | 52 | −12.3 |
| Comparative Example 3 | (A)-2 [100] | (G1)-1 [10] | (C)-1 [10] | — | (D)-1 [4] | (S)-1 [3000] | 64.3 | 54.4 | −8.9 |

In Table 1, the reference characters indicate the following; and the values in brackets [ ] indicate the amount (in terms of parts by weight) of the component added.

(A)-1: polymeric compound (A)-1 shown below [Mw=7,000, Mw/Mn=1.51. 1/m=50/50 (molar ratio)].

(A)-2: polymeric compound (A)-2 shown below [Mw=7,000, Mw/Mn=1.50. 1/m=50/50 (molar ratio)].

(G1)-1: a compound (G1)-1 shown below.

(C)-1: a compound (C)-1 shown below.

(K)-1: a compound (K)-1 shown below.

(D)-1: HFBA: 1H,1H-heptafluorobutylamine.

(S)-1: a mixed solvent of PGMEA/PGME=80/20 (weight ratio).

[Chemical Formula 43]

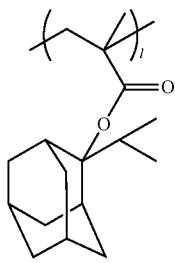
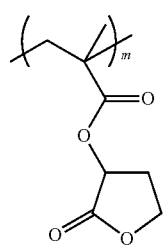

(A)-1

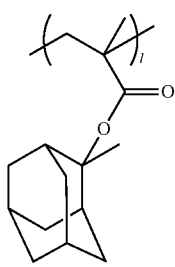
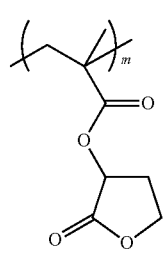

(A)-2

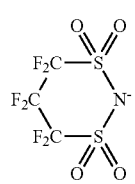
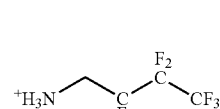

(G1)-1

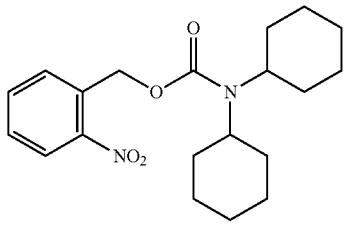

(C)-1

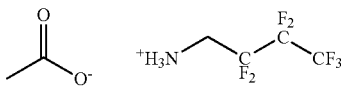

(K)-1

<Formation of Resist Film>

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 82 nm.

Then, each resist composition immediately after preparation thereof was applied using a spinner, followed by drying without conducting a prebake (PAB) treatment, thereby forming a resist film having a thickness of 100 nm.

After formation of the resist film, the resist film was allowed to stand at room temperature (23° C.) for 24 hours. Then, the receding angle was measured.

<Evaluation of Receding Angle>

A water droplet was dripped onto the surface of each resist film (the resist film prior to exposure), and a DROP MASTER-700 apparatus (product name, manufactured by Kyowa Interface Science Co., Ltd.) was used to measure the receding angle (receding angle measurement: water 50 μL). The result of this measurement is referred to as the "initial receding angle (°)". The results are shown in Table 1.

<Evaluation of Post Exposure Stability of Latent Image>

After formation of the resist films (the resist film prior to exposure), the resist films were allowed to stand at room temperature (23° C.) for 24 hours. Then, the receding angles were measured in the same manner as described. The result of this measurement is referred to as the "still-standing receding angle (°)". The results are shown in Table 1.

In Table 1, the difference of receding angle before and after still-standing is further shown as ΔrCA(°).

From the results shown above, it was confirmed that the resist composition of Examples 1 to 3 according to the present invention had less decrease of receding angle before and after being allowed to stand at room temperature (23° C.) for 24 hours, as compared to the resist composition of Comparative Examples 1 to 3, and exhibited excellent post exposure stability of the latent image.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

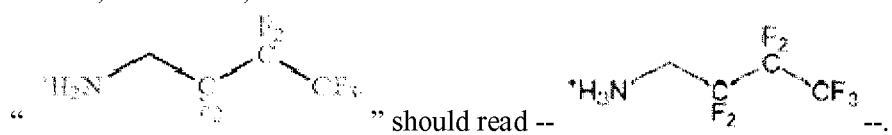

What is claimed is:

1. A resist composition which generates a base upon exposure and exhibits increased solubility in an alkali developing solution under the action of acid,
the resist composition comprising:
a base component (A) that exhibits increased solubility in an alkali developing solution under the action of acid;
an acidic compound component (G1) comprising a nitrogen-containing cation having a pKa value of 7 or less and a counteranion; and
a buffer component (K) comprising a nitrogen-containing cation and a counteranion being a conjugate base for an acid having a pKa value of 0 to 5.

2. The resist composition according to claim 1, wherein the buffer component (K) is a salt compound comprising a nitrogen-containing cation having a pKa value of 7 or less and a counteranion being a conjugate base for an acid having a pKa value of 0 to 5.

3. The resist composition according to claim 1, wherein the buffer component (K) is a salt compound comprising a nitrogen-containing cation having a pKa value of 7 or less and a counteranion being a conjugate base for a carboxylic acid or a sulfonic acid having a pKa value of 0 to 5.

4. The resist composition according to claim 1, wherein the buffer component (K) is a salt compound having an anion moiety represented by general formula(K-1) shown below:

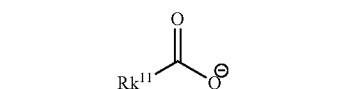
(K-1)

wherein $Rk^{11}$ represents a hydrocarbon group which may have a substituent.

5. The resist composition according to claim 4, wherein $Rk^{11}$ represents a chain-like aliphatic hydrocarbon group.

6. The resist composition according to claim 4, wherein $Rk^{11}$ represents a chain-like alkyl group.

7. The resist composition according to claim 4, wherein $Rk^{11}$ represents a linear alkyl group preferably has 1 to 20 carbon atoms.

8. The resist composition according to claim 4, wherein the buffer component (K) is a compound represented by formula (K)-1 shown below:

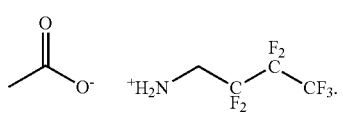
(K)-1

9. The resist composition according to claim 1, wherein the pKa of the counteranion of the acidic compound component (G1) is 0 or less.

10. The resist composition according to claim 1, wherein the counteranion of the acidic compound component (G1) is represented by general formula (G1a-3) shown below:

(G1a-3)

wherein X" represents an alkylene group of 2 to 6 carbon atoms in which at least one hydrogen atom has been substituted with a fluorine atom.

11. The resist composition according to claim 1, wherein the acidic compound component (G1) is represented by formula (G1)-1 shown below:

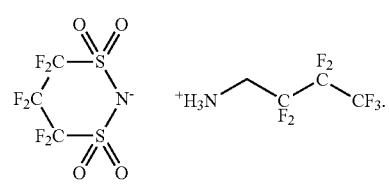
(G1)-1

12. The resist composition according to claim 1, which further comprises a photo-base generator component (C).

13. The resist composition according to claim 12, wherein the photo-base generator component (C) is represented by general formula (C1-11) or (C1-12) shown below:

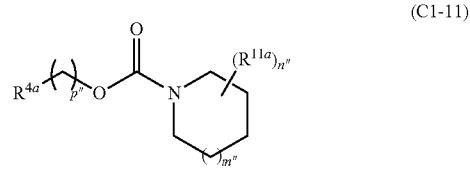
(C1-11)

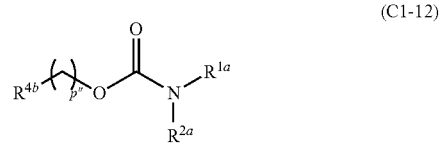
(C1-12)

wherein $R^{4a}$ and $R^{4b}$ each independently represents a ring skeleton selected from benzene, biphenyl, indene, naphthalene, fluorene, anthracene, phenanthrene, xanthone, thioxanthone and anthraquinone which may have a substituent; $R^{1a}$ and $R^{2a}$ each independently represents an alkyl group of 1 to 15 carbon atoms or a cycloalkyl group; $R^{11a}$ represents an alkyl group of 1 to 5 carbon atoms; m" represents 0 or 1; n" represents 0 to 3; and each p" independently represents 0 to 3.

14. A method of forming a resist pattern, comprising: forming a resist film on a substrate using a resist composition according to claim 1; conducting exposure of the resist film; and developing the resist film to form a resist pattern.

15. A method of forming a resist pattern, comprising:
applying a resist composition according to claim 1 to a substrate to form a resist film;
subjecting the resist film to exposure;
conducting a bake after the exposure, such that, at an unexposed portion of the resist film, the solubility of a base component (A) in an alkali developing solution is increased by the action of the acidic compound component (G1) comprising of a nitrogen-containing cation having a pKa value of 7 or less and a counteranion; and subjecting the resist film to an alkali development, thereby forming a negative-tone resist pattern in which the unexposed portion of the resist film has been dissolved and removed.

* * * * *

UNITED STATES PATENT AND TRADEMARK OFFICE
CERTIFICATE OF CORRECTION

PATENT NO. : 9,023,585 B2
APPLICATION NO. : 13/922758
DATED : May 5, 2015
INVENTOR(S) : Nakamura et al.

It is certified that error appears in the above-identified patent and that said Letters Patent is hereby corrected as shown below:

In the specification
Col. 7, lines 22-25:

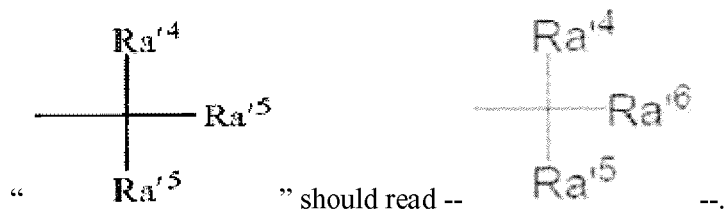

Col. 7, line 43, "(a1-r-1)" should read --(a1-r2-1)--.
Col. 7, line 44, "(a1-r-1)" should read --(a1-r2-1)--.
Col. 16, line 38, "n'"" should read --n'--.
Col. 16, line 38, "m'"" should read --m'--.
Col. 25, line 61, "I." should read --1.--.
Col. 43, lines 48-49, "heterocyclc" should read --heterocyclic--.
Col. 43, lines 53-54, "heterocyclc" should read --heterocyclic--.
Col. 45, line 63, "$R^3$" should read --$R^5$--.
Col. 49, line 58, "Ra" should read --$R^a$--.
Col. 49, line 61, "Ra" should read --$R^a$--.
Col. 52, line 5, "Ra" should read --$R^a$--.
Col. 52, line 11, "Ra" should read --$R^a$--.
Col. 54, line 44, "[—$CH_2C_2CH_2CH_2CH_2C_2$—]." should read --[—$CH_2CH_2CH_2CH_2CH_2$—].--.
Col. 55, line 33, "Ra" should read --$R^a$--.
Col. 55, line 54, "Ra" should read --$R^a$--.
Col. 55, line 64, "Ra" should read --$R^a$--.
Col. 59, line 56, "alphalactum" should read --alphalactam--.

Signed and Sealed this
Sixteenth Day of February, 2016

Michelle K. Lee
*Director of the United States Patent and Trademark Office*

CERTIFICATE OF CORRECTION (continued)

U.S. Pat. No. 9,023,585 B2

Col. 61, line 39:

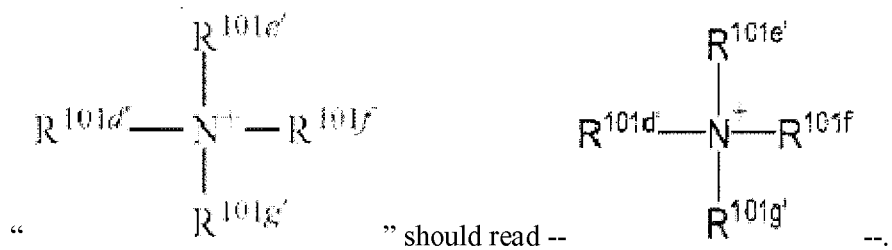

Col. 62, lines 7-8, "isooxazole" should read --isoxazole--.
Col. 67, line 20, "$R^{4'''}$" should --$R^{4'''}$--.
Col. 68, line 7, "$R^{4'''}$—" should --$R^{4'''}$— --.
Col. 71, line 14, "3.18±0.10" should read --3.18±0.30--.
Col. 77, line 22, "heptatluorobutylamine)," should read --heptafluorobutylamine),--.
Col. 81, line 49, "he" should read --the--.
Col. 82, line 44, "at" should read --as--.
Col. 82, line 52, "$C_3HCl_2Fs$," should read --$C_3HCl_2F_5$,--.
Col. 83, lines 27-28, delete "The baking . . . reaction." and insert the same on Col. 83, Line 28, as a new paragraph.
Col. 83-84 (Table 1), line 5, "6.35" should read --63.5--.
Col. 85, line 20, "7,000," should read --7,100,--.
In the claims
Col. 87, lines 60-63, claim 8: